(12) United States Patent
Kern et al.

(10) Patent No.: US 10,216,573 B2
(45) Date of Patent: Feb. 26, 2019

(54) METHOD OF OPERATING A MEMORY DEVICE

(71) Applicant: Infineon Technologies AG, Neubiberg (DE)

(72) Inventors: Thomas Kern, Aschheim (DE); Michael Goessel, Mahlow (DE); Karl Hofmann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 85 days.

(21) Appl. No.: 15/410,912

(22) Filed: Jan. 20, 2017

(65) Prior Publication Data
US 2017/0220417 A1    Aug. 3, 2017

(30) Foreign Application Priority Data
Jan. 28, 2016    (DE) .................. 10 2016 101 543

(51) Int. Cl.
| | |
|---|---|
| *H03M 13/00* | (2006.01) |
| *G06F 11/10* | (2006.01) |
| *G11C 29/52* | (2006.01) |
| *H03M 13/15* | (2006.01) |
| *H03M 13/29* | (2006.01) |
| *G11C 29/04* | (2006.01) |

(52) U.S. Cl.
CPC .......... *G06F 11/1068* (2013.01); *G11C 29/52* (2013.01); *H03M 13/152* (2013.01); *H03M 13/2906* (2013.01); *H03M 13/616* (2013.01); *G11C 2029/0411* (2013.01)

(58) Field of Classification Search
None
See application file for complete search history.

(56) References Cited

U.S. PATENT DOCUMENTS

| | | | | |
|---|---|---|---|---|
| 8,418,026 | B2* | 4/2013 | D'Abreu | G06F 11/1012 714/752 |
| 2008/0270682 | A1* | 10/2008 | Lasser | G06F 9/4403 711/103 |
| 2009/0327581 | A1* | 12/2009 | Coulson | G11C 16/3418 711/103 |
| 2010/0125765 | A1* | 5/2010 | Orbach | G06F 11/1048 714/718 |

(Continued)

FOREIGN PATENT DOCUMENTS

DE    102015215401.7 A1    2/2017

OTHER PUBLICATIONS

Guillermo, A. et al. "Tolerating Multiple Failures in RAID Architectures with Optimal Storage and Uniform Declustering", in Jin, H., Cortes, T. and Buyya,R. (ed.): High Preformance Mass Storage and Parallel I/O, IEEE Press 2002, pp. 161-172.

*Primary Examiner* — Guerrier Merant
(74) *Attorney, Agent, or Firm* — Viering, Jentschura & Partner MBB

(57) ABSTRACT

In various embodiments, a method of correcting and/or detecting an error in a memory device is provided. The method may include, in a first operations mode, applying a first code to detect and/or correct an error, and in a second operations mode after an inactive mode and before entering the first operations mode, applying a second code for correcting and/or detecting an error, wherein the first code and the second code have different code words.

26 Claims, 11 Drawing Sheets

(56) References Cited

U.S. PATENT DOCUMENTS

| | | | |
|---|---|---|---|
| 2011/0289386 A1* | 11/2011 | Yang | G06F 11/106 |
| | | | 714/764 |
| 2012/0233520 A1* | 9/2012 | Aoyagi | G06F 11/1008 |
| | | | 714/755 |
| 2013/0145231 A1 | 6/2013 | Frayer et al. | |
| 2014/0245098 A1* | 8/2014 | Sharon | G06F 11/1012 |
| | | | 714/755 |
| 2014/0281772 A1* | 9/2014 | Jeon | G11C 16/3404 |
| | | | 714/721 |
| 2014/0327796 A1 | 11/2014 | Lin et al. | |
| 2015/0081192 A1* | 3/2015 | Pongracz | B60W 50/0205 |
| | | | 701/99 |
| 2017/0116070 A1* | 4/2017 | Alrod | G06F 11/0793 |
| 2017/0262335 A1* | 9/2017 | Matsuo | G06F 11/1068 |
| 2017/0357581 A1* | 12/2017 | Yanagidaira | G06F 12/0653 |

* cited by examiner

FIG 1A

| 11 | 12 | 12' | | 1N | 1N' | 13 |
|---|---|---|---|---|---|---|
| $d^1$ | $c^1(d^1)$ | $d^2$ | $c^2(d^2)$ | ... | $d^N$ | $c^N(d^N)$ | $\gamma(d^1, d^2, ..., d^N)$ |

| 11 | 11' | 12 | 12' | | 1N | 1N' | 13 | 14 |
|---|---|---|---|---|---|---|---|---|
| $d^1$ | $c^1(d^1)$ | $d^2$ | $c^2(d^2)$ | ... | $d^N$ | $c^N(d^N)$ | $\gamma(d^1, d^2, ..., d^N)$ | $c(\gamma)$ |

101

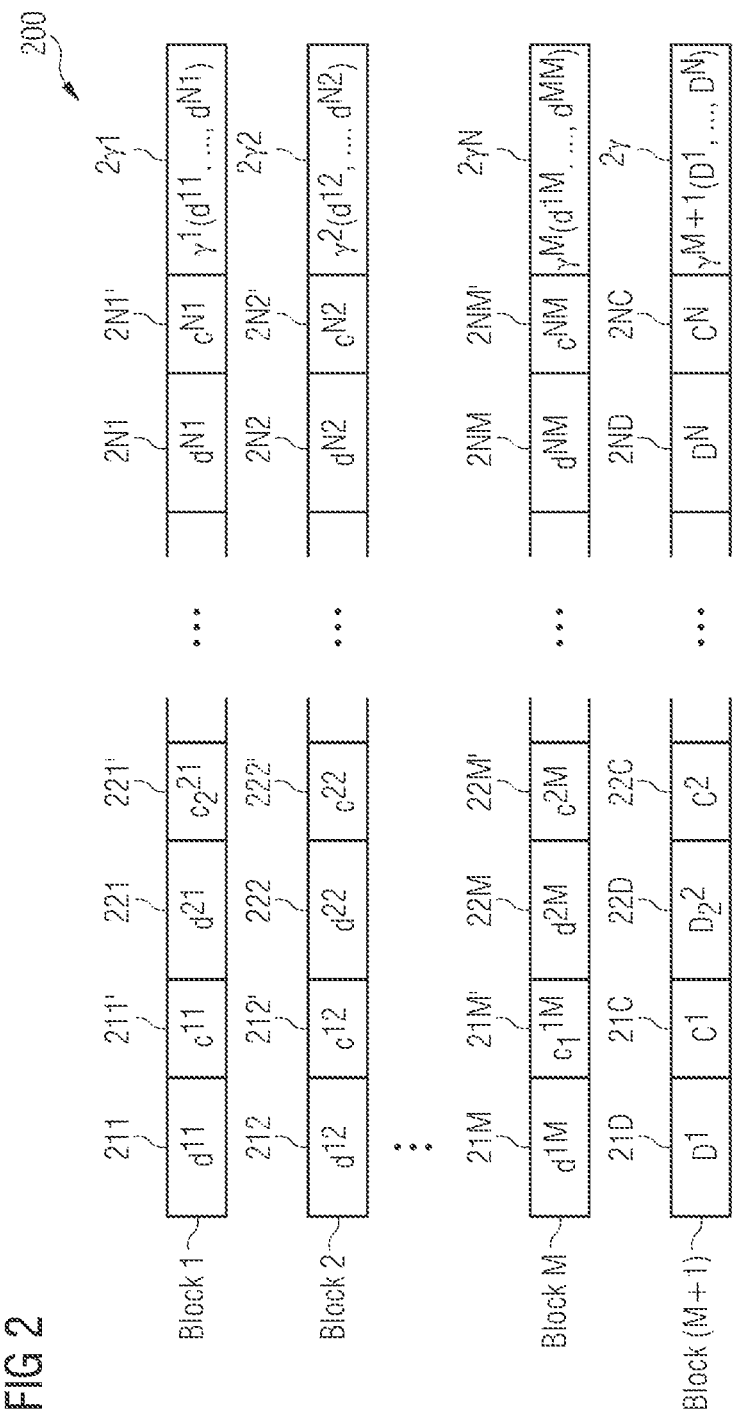

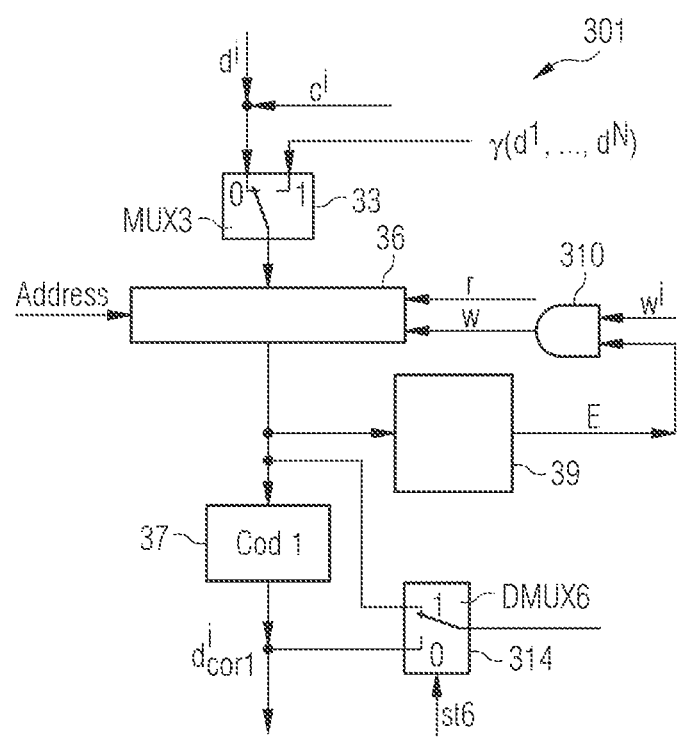

METHOD OF OPERATING A MEMORY DEVICE

CROSS-REFERENCE TO RELATED APPLICATION

This application claims priority to German Patent Application Serial No. 10 2016 101 543.1, which was filed Jan. 28, 2016, and is incorporated herein by reference in its entirety.

TECHNICAL FIELD

Various embodiments relate generally to a method of operating a memory device.

BACKGROUND

Known memory devices include volatile and non-volatile memory devices. Volatile memory devices, for example static random access memory devices (SRAMs) or dynamic random access memory devices (DRAMs) lose information stored in their memory cells when their operating power is switched off. In non-volatile memory devices, for example in a flash memory, stored information is kept even if its operating power is switched off.

A memory device may include a plurality of memory cells.

In a case of a binary non-volatile memory cell, the memory cell may be in one of two states, which may be referred to as 0 and 1, respectively.

If the memory cell is in the 0 state, a write process of writing a 0 may leave the memory cell in the 0 state, whereas a process of writing a 1 may bring the memory cell to a 1 state. In other words, in the 0 state, an arbitrary value of the binary values may be written to the memory cell. The writing process may also be referred to as a programming of the memory cell.

If the memory cell is in the 1 state, the memory cell remains in the 1 state, irrespective of which of the binary values is supposed to be written to the memory cell by a writing process, which may be disadvantageous. It may be possible to set all memory cells in a region of a memory device to the 0 state. This may be referred to as clearing of the memory device. After a clearing of the memory cells of the region, arbitrary values may (e.g. again) be written to the memory cells of the cleared region. It may thus be a laborious process to write information to a flash memory device, if the memory cells of the device have earlier been used for storing information and thus have been programmed.

In contrast to volatile memory devices, e.g. flash memory devices, non-volatile device, e.g. MRAM memory devices, which may include a plurality of memory cells, may store information permanently, even if no operating power is applied. It may be possible to write arbitrary values of the binary values to a memory cell of the plurality of memory cells of the MRAM memory device, independent of a current state of the memory cell.

In known MRAM memory devices, quantum effects may cause erroneous values in the memory cells, which may be disadvantageous. A number of errors may depend on external parameters. The number of errors may for example depend on temperature, i.e. increase with increasing temperature. The number of errors may increase with time.

For keeping the number of errors small, even after a passage of time, data stored in the memory cells may be stored as code words of an error correcting code. Thus, by using an error correction process, the number of errors may be kept small. Potentially erroneous data may be read and be corrected using the error correcting code. The corrected data may be written back to the memory cells, such that the original data may in many cases be reproduced error-free. Here, it may be necessary that it is possible for the errors to be corrected by applying the code. For correcting the errors, an operating power may be required. If an MRAM memory device is not used for a long time, it may be likely that a relatively large number of errors is present in the memory cells. In a state in which the memory device is not used, no read processes (also referred to as read accesses) and no write process (also referred to as write accesses) are executed. In many cases, no operating power may be present.

A state of a memory device in which no read process and no write process takes place may be referred to as an inactive state, an inactive mode, an inactive phase or an idle phase. Such an inactive state may be a regular state in many or even most non-volatile memory devices. It may for example occur in a memory device that is used in a vehicle, for example in a car, a bus, a commercial vehicle, etc. It may happen that such a vehicle is not used for a certain amount of time, for example several days or weeks. During this time, the memory device may possibly not be provided with operating power, which might be required for correcting errors in memory cells of the memory device, and for restoring correct values in the memory cells.

From the inactive state, the memory device may be transferred into an active state, in which read and/or write processes may take place. Such a transitional state may be referred to as power-up or start-up. During start-up, after the inactive state is ended and the memory device is in the process of entering the active mode, with read and/or write processes taking place in the start-up phase, correcting of errors occurring during the inactive state may be executed. Depending on a duration of the inactive state, for example during a relatively long inactive state, for example an inactive state lasting for several days or weeks, a relatively large number of errors may accumulate. Such a large number of errors may possibly not be correctable using the code used for correcting errors during the active phase. This may be a disadvantage.

SUMMARY

A method of operating a memory device is provided. The method may include: in a first operations mode, applying a first code to detect and/or correct errors, and in a second operations mode after an inactive mode and before entering the first operations mode, applying a second code for correcting errors wherein the first code and the second code have different code words.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A shows, in accordance with various embodiments, a schematic representation of data bits and first and second check bits of a first code and of a second code, respectively, assigned to memory cells of a memory device;

FIG. 1B shows, in accordance with various embodiments, a schematic representation of data bits, first and second check bits of a first code and of a second code, respectively, and additional check bits, assigned to memory cells of a memory device;

FIG. 2 shows, in accordance with various embodiments, a schematic representation of data bits and check bits assigned to memory cells of a memory device for a block-wise organization of the storage device;

FIG. 3B shows, in accordance with various embodiments, a partial view of a schematic of a circuit for correcting data bits read from a memory device and for a correct restoring of erroneous values in memory cells of the memory device, wherein the circuit may include an error detection circuit;

DESCRIPTION

Figure 3A:
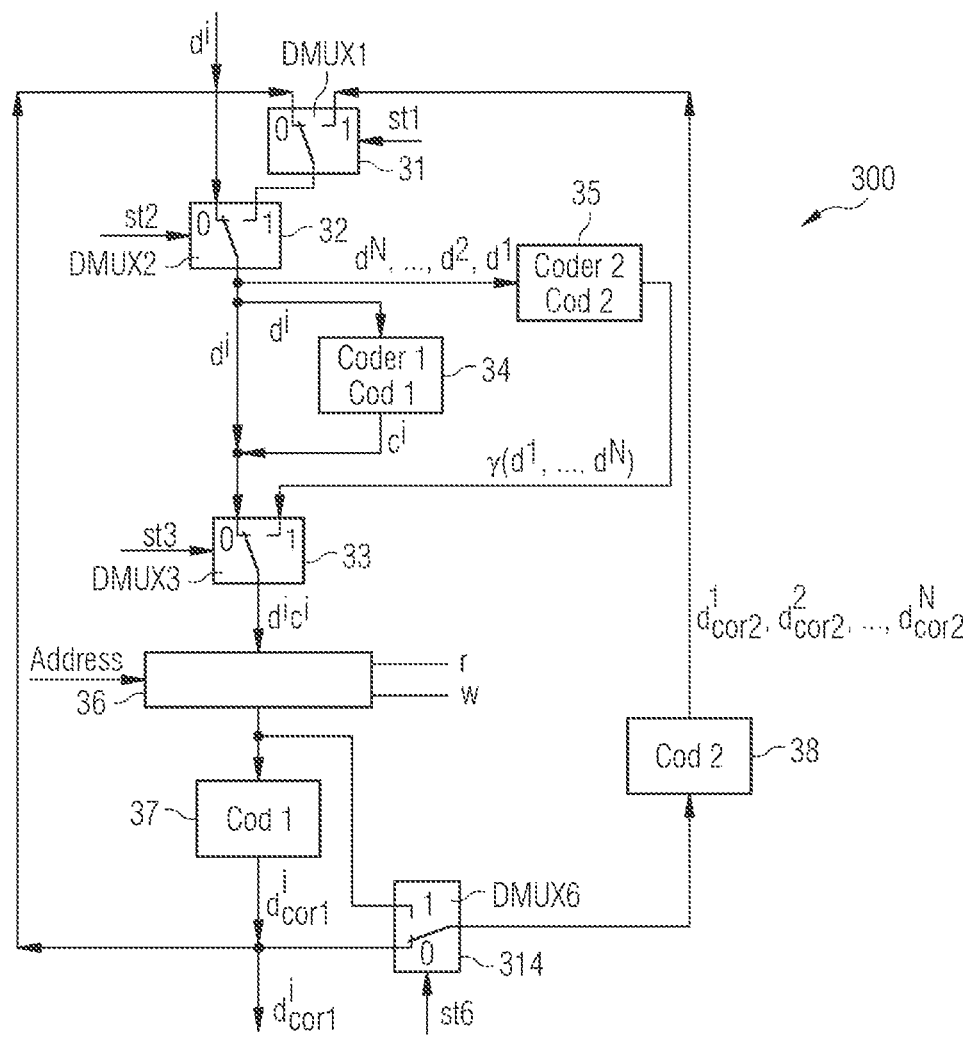
FIG. 3A shows, in accordance with various embodiments, a schematic of a circuit for correcting data bits read from a memory device and for a correct restoring of erroneous values in memory cells of the memory device.

The following detailed description refers to the accompanying drawings that show, by way of illustration, specific details and embodiments in which the invention may be practiced.

The word 'exemplary' is used herein to mean 'serving as an example, instance, or illustration'. Any embodiment or design described herein as "exemplary" is not necessarily to be construed as preferred or advantageous over other embodiments or designs.

The word 'over' used with regards to a deposited material formed 'over' a side or surface, may be used herein to mean that the deposited material may be formed 'directly on', e.g. in direct contact with, the implied side or surface. The word 'over' used with regards to a deposited material formed 'over' a side or surface, may be used herein to mean that the deposited material may be formed 'indirectly on' the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In various embodiments, a method of operating a memory device may be provided that may prevent or alleviate a disadvantage of known methods of operating a memory device of possibly not being able to correct a large number of errors that may accumulate during an inactive state, for example during an inactive state with a long duration.

In various embodiments, a memory device, e.g. an MRAM, may be provided that may provide all of the following functionalities: the memory device may be suitable for normal fast read and write operations (e.g. as a replacement for an SRAM); the memory device may be suitable for storing data for a long time in an inactive state with no read and write operations (e.g. as a replacement for a flash memory device); and it may be possible to adapt a method used for operating the memory device to different degrees of reliability of used memory cells, e.g. MRAM cells, of the memory device.

Many, possibly most or all, non-volatile memory devices may be configured to be transferred to an inactive state, in which no reading to the memory device and no reading from the memory device is executed. The inactive state may for example be assumed occasionally or regularly. A dedicated signal may be required for transferring the memory device from an active state, in which data are read from the memory device or data are written to the memory device, to the inactive state, e.g. an inactive-state-start signal. A dedicated signal may be required for transferring the memory device from the inactive state to an active state, e.g. an inactive-state-end signal.

In various embodiments, after, e.g. immediately after, ending the inactive state, a so-called start-up phase may be entered. In such a start-up phase, certain pre-defined processes may be executed for preparing the memory device and/or a host device, into which the memory device may be integrated, such that the memory device, and possibly the host device, may be ready for normal operations.

An example for a start-up phase (which may also be referred to as a start-up mode or as a second operations mode) and a normal operations phase (which may also be referred to as normal operations mode or first operations mode) may be a memory device used in a motorized vehicle, e.g. a car, a bus, a commercial vehicle, a ship, an airplane, etc. In examples described herein, reference may be made to a car. It is to be understood, however, that the examples may similarly apply to any other motor-driven vehicle, for example, but not limited to, those listed above.

A memory device used in a car may regularly enter an inactive phase, for example when the car is turned off. The memory device may be cut off from a power supply during that phase. When the car is started, the memory device may be provided with power again, and it may undergo a start-up phase (in automotive context, this may also be referred to as boot phase). A normal operations phase may be entered when the motor is started, or at least when typical processes executed during start-up are completed. A combination of start-up phase and normal operations phase may (e.g. in automotive context) be referred to as key-on phase. The key-on phase may start when a key is moved from an off-position (key-off) to an ignition-on or to a motor-startposition (or, in keyless devices, when a comparable action is executed), and may end when the key is returned to the off-position.

Another example for an inactive phase in a car may be referred to as a sleep mode. In sleep mode, no read process from the memory device and no write process to the memory device may be performed. However, a data traffic passing in e.g. a bus system to which the memory device may be connected may be monitored, and if data, e.g. a command, are/is encountered that may be directed at the memory device, the memory device may be woken up from sleep mode. During sleep mode, the memory device may or may not be provided with power.

In various embodiments, a probability of erroneous values occurring in a memory device, e.g. of errors remaining after a correction and being present during an active phase, may be reduced, even though a large number of erroneous values may have accumulated during the inactive state. The memory device may for example be an MRAM.

In various embodiments, it may be achieved that an MRAM memory device that may allow a writing of arbitrary data to memory devices, may be provided with a reliability that may allow its application for long-term data storage, i.e. as a non-volatile memory device.

In various embodiments, data may be a representation of an information or of a plurality of pieces of information. Each of the data may include a plurality of data units. The data may for example be binary data, i.e. each data unit may have one of two values. The two values may be referred to as 0 and 1, respectively. In the case of binary data, the data unit may be referred to as bit.

In various embodiments, different codes with different correction capacities and different speeds of correction may be used for different modes of operation of a memory device.

In various embodiments, a first code and a second code may be used.

A code may consist of a plurality of code words. Each code word of a given code may consist of a plurality of code word units. Each code word of a given code may differ from any other code word of the code in a minimum number of code word units. The minimum number of code word units may be referred to as a code distance. The code distance of a code may be used for describing its capability to detect and/or correct errors in coded data. For example, a code with a code distance d between its code words can detect up to d−1 errors (also referred to as the error-detecting capability of the code) and can correct [(d− 1)/2] errors (also referred to as the error-correcting capability of the code).

The plurality of code word units may include at least one data unit. In various embodiments, the plurality of code word units may further include at least one check unit. For example, an error correcting code may include at least one data unit, e.g. at least one data bit, and at least one check unit, e.g. at least one check bit.

In various embodiments, data may be stored as coded data, i.e. as code words of a code. For example, the data may be represented in the at least one data unit. At least one check bit may be added for being able to check if the data units are correct. If the data are coded error-free, then each data word is a word of the code, also referred to as a codeword. However, if an error occurs, for example by quantum effects taking place during an inactive state of a memory device in which the coded data are stored, the data may or may not represent one or more words of the code any more. In order to differentiate the coded words that may contain one or more errors, and thus may or may not be words of the code, from the error-free coded data, the error-ridden words may be referred to as data words, and the error-free words may be referred to as data code words.

The quantum effects that may introduce errors in stored data may occur during an active state, as well as during an inactive state. However, whereas during an active state, errors may continuously be corrected and thus be prevented from accumulating, this may not be the case during an inactive state, and thus errors may accumulate when a memory device is in an inactive state.

In various embodiments, the first code may have a first code distance. The second code may have a second code distance. In various embodiments, the first code may be used for correcting, e.g. relatively fast, errors in data read from the memory device during an active mode. Thereby, errors in the data read from the memory device may be corrected if the errors are correctable using the first code. Such a mode of operation of the memory device may also be referred to as a first operations mode.

The second code may have codewords different to codewords of the first code.

In various embodiments, the second code may be used for correcting data, e.g. bits, read from a memory device, e.g. from an addressed area, for example after an inactive state ends. The data, e.g. the bits, that may be corrected by applying the second code, may be written to respective memory cells of the memory device for restoring correct values in the memory device after the end of the inactive state. Such a mode of operation of the memory device may also be referred to as a second operations mode.

In various embodiments, the second code may have a second code distance. The second code distance may, in various embodiments, be larger than the code distance of the first code, i.e. the first code distance. Thereby, errors that may not be correctable by applying the first code may be correctable by applying the second code.

The first code distance and the second code distance may, in various embodiments, be selected in such a way that a desired reliability of a memory device and its memory cells may be guaranteed.

In various embodiments, in the second operations mode, a correction of erroneous data units, e.g. bits, may be performed by applying a combination of the first code and of the second code.

In various embodiments, the first code may be used for determining positions of errors, and the second code may be used for correcting the errors using the error positions determined by applying the first code. Thus, an error correction as a so-called erasure may be possible.

In various embodiments, an erroneous data word, which may be addressed by an address of a memory device, may be determined using a first code. As a second code, a code may be used that may be capable of correcting a plurality of code units, e.g. a byte-correcting code. The second code may be used for correcting the plurality of code units, e.g. byte or bytes, wherein the byte or bytes to be corrected may be known from the application of the first code. In various embodiments, it may be possible that a correction using the second code may take longer than a correction using the first code.

In various embodiments, the first code and the second code may be used in parallel during a correction.

In various embodiments, one of the codes, for example the second code, may be implemented sequentially, e.g. for a sequential error detection and error correction, if enough time for a correction is available. This may for example be the case during a start-up.

In various embodiments, both codes, i.e. the first code and the second code, may be implemented sequentially, if enough time for a correction is available. This may for example be the case during a start-up.

In various embodiments, in addition to the first code and the second code, one or more additional codes, e.g. a third code, a fourth code, etc., may be used for an error correction.

In various embodiments, the first code may be a block-code, for instance a Hamming code, a shortened Hamming code, a Hsiao code, a shortened Hsiao code, a t-bit-error correcting BCH code, a shortened t-bit-error correcting BCH code, for example with t≥2, a Reed-Muller-Code, a shortened Reed-Muller-Code, a cyclic code, a shortened cyclic code, or a byte-correcting code.

In various embodiments, the second code or a third code may be a block code, for instance a parity code, a Hamming code, a shortened Hamming code, a Hsiao code, a shortened Hsiao code, a t-bit-error correcting BCH code, a shortened t-bit-error correcting BCH code, for example with t≥2, a Reed-Muller-Code, a shortened Reed-Muller-Code, a cyclic code, a shortened cyclic code, a Reed-Solomon-Code, a shortened Reed-Solomon-Code, a modified Reed-Solomon-Code, a RAID-code, a byte-correcting code or a Low-Density Parity Code. Also other codes may be used, for example a non-linear code, which may be known to the person skilled in the art. Also a convolutional code or a turbo code or any other error detecting or correcting code can be used, for example as a second or a third code.

In various embodiments, the second code or one of the additional codes may form an erasure correction, if a possible position of an error, for example an erroneous byte of a certain word length or an erroneous block of a memory device that may be organized as blocks, is indicated from an application of the first code or/and the second code.

In various embodiments, a method of correcting data units, e.g. bits, bytes, multi-valued values or sub-bit values, read from a memory device and for restoring data units, e.g. bits, bytes, multi-valued values or sub-bit values stored in memory cells of an addressable memory device, may be provided. In various embodiments, the memory device may store one bit per memory cell, multiple bits or a value of a range of multiple values, or, e.g. for improving a robustness of the device, a bit may be stored in multiple memory cells, e.g. in two cells, such that in each memory cell only a fraction of a bit may be stored, e.g. 0.5 bits/cell. In the memory cells of the addressable memory device, the data units, e.g. bits, first check units, e.g. first check bits, corresponding to data units, e.g. data bits, and second check units, e.g. second check bits, corresponding to data units, may be stored. In a case of no errors being present, the data units, e.g. data bits, and the corresponding first check units, e.g. first check bits, may form code words of a first error detecting and/or error correcting code, and the data units, e.g. the data bits, and the corresponding second check units, e.g. second check bits, may form code words of a second error detecting and/or error correcting code.

In various embodiments, the code words of the first code may be different from the code words of the second code.

In various embodiments, the addressable memory device may have a first operations mode, wherein, in the first operations mode, data units, e.g. data bits, and their corresponding first check units, e.g. first check bits, may be read from the memory device and be provided for further use. The addresses of the addressable memory device from which the data units and the check units are read may be determined according to the task to be performed.

In various embodiments, the addressable memory device may include a second operations mode that may be different from the first operations mode. The second operations mode may be used for a correct restoring of erroneous values in memory cells of the addressable memory device.

In a case of an error being present in the data units read in a first operations mode, the error may, in various embodiments, be corrected in the data units read from the memory device by applying the first code, if the error is an error that is correctable using the first code, and the corrected data units, e.g. data bits, may be provided for further use.

In various embodiments, in the second operations mode, data units, e.g. data bits, and second check units, e.g. second check bits, corresponding to the data bits, may be read from the addressable memory cells for a nonempty subset of addresses of the addressable memory device.

Errors in the data units, e.g. data bits, read from the memory device that may be corrected using the second code may, in various embodiments, be corrected using the second code, and corrected data bits may be written back to corresponding memory cells of the memory device, such that erroneous values that may have been present in the memory cells, e.g. in one or more of the memory cells, may be stored correctly again in the memory cells.

In the second operations mode, it may also, in various embodiments, be possible to use the first code and the second code for restoring correct values in the memory cells.

In various embodiments, data units, e.g. data bits, first check units, e.g. first check bits, and second check units, e.g. second check bits, may be stored in a memory device. The data units and the first check units may form a code word of a first error correcting code, which may for example be a 2-units (e.g. 2-bit correcting) or a 3-units (e.g. 3-bit correcting) BCH code. The data units and the second check units may form a code word of a second error correcting code, for example a 20-units (e.g. 20 bit-error correcting BCH-code or a byte-correcting Reed-Solomon Code. The check units of the second code may be determined from the data bits of a sequence of words accessed by a sequence of addresses.

In various embodiments, the units, e.g. the bits, of all data words of a memory block may be information units, e.g. bits, of a code word for which the second check bits for the second code may be determined.

In various embodiments, the second code may be a t-units—(e.g. t-bit-) error correcting BCH code or a byte-error correction code, a Low-Density-Parity Code or a RAID-code.

In various embodiments, a method of operating a memory device may include a first operations mode, which may also be referred to as a normal operation mode. The first operations mode may be regarded as a replacement for an SRAM device. In the first operations mode, data units (e.g. data bits) may be read together with corresponding first check units (e.g. check bits), and an error correction may be performed on the data units and the check units using the first code. Data units and corresponding first check units may be accessed by a single address. A fast error correction and error detection may be implemented in parallel. The first code may be a Hsiao-code or a t-units (e.g. a t-bit-) error-correcting BCH-code, wherein t may be approximately 2 or 3. In various embodiments, check units (e.g. check bits) of the second code may be determined from data units of a sequence of words accessed by a sequence of addresses. Units, e.g. bits, of all the data words of a memory block may be information units, e.g. information bits, of a code word for which second check units, e.g. second check bits, for the second code may be determined. The second code may be selected as a t-units (e.g. t-bit) error correcting BCH-code, with t approximately 20, or a unit-error, e.g. byte-error, correction code.

In various embodiments, a method of operating a memory device may include a second operations mode, also referred to as memory restoring mode. The second operations mode may be regarded as a replacement for a flash memory device. An error correction of data units may be performed by using a second code. Units, e.g. bits, of a code word may be accessed by a sequence of addresses. An error correction and an error detection may be implemented sequentially (e.g. using a Berlekamp-Massey-Algorithm for a BCH-code) or in parallel (e.g. for a byte-error correcting code).

In various embodiments, data for a plurality of addresses of a block may be read, corrected according to the first code, and if an error is corrected, the (corrected) data may be written back to the memory. In a case of a non-correctable error being present in the data, the data may not be written back. Data corrected by the first code may be read for the addresses of a block and corrected according to the second code. The corrected data may be written back to memory.

In various embodiments, an additional code, e.g. a block storing an XOR sum of units, e.g. bits, of data blocks, may be provided. In that case, a method of operating a memory device may, according to various embodiments, include correcting data by applying a first code, correcting data by applying a second code, and correcting data by applying the additional code, e.g. as an erasure.

In various embodiments of operating a memory device, addresses may be included in a coding- and a decoding process.

In that case, data bits and address bits and the corresponding check bits may for example form a codeword of the first code, or data bits, bits derived from address bits and corresponding check bits may form a codeword.

In various embodiments, address bits or bits derived from address bits may also be stored in memory cells.

In various embodiments, corrected data may be written to a second memory device, wherein the second memory device may be different from a first memory device from which the data are read.

In various embodiments, corrected data may only be written back to the memory device during the first operations mode if a number of corrected units, e.g. bits, is larger than a given threshold value. For example, for a 3-bit error correcting code, the data may be written back if a 2-bit error or a 3-bit error was corrected. If a 1-bit error was corrected, the 1-bit error may remain in the memory device. Two additional errors may yet be corrected by the 3-bit error correcting code.

In various embodiments, the second check units, e.g. check bits, described above may be formed as different types of updates, e.g. during or after the first operations mode. For example, the second check units may be formed, e.g. updated, before a shut down of the memory device. Thus, the second check units may be formed after the first operations mode. In another example, the second check units may be formed, e.g. updated, during the first operations mode, e.g. if a write operation occurs.

In various embodiments, the second operations mode may be used at a beginning of a start-up (of the memory device).

In various embodiments, data may only be written back to the memory device if there was a correction (since the memory device, e.g. an MRAM memory device, may have discrete values stored in the memory cells).

In various embodiments, a method of correcting data units read from memory cells of an addressable memory device, e.g. an MRAM-device, and for restoring data units stored in the memory cells of the addressable memory device may be provided, wherein data units, e.g. data bits, first check units, e.g. first check bits, and second check units, e.g. second check bits, may be stored in memory cells of an addressable memory device. In a no-error-case, the data units and the first check units may be code words of a first error detecting/error correcting code, and the data units and corresponding second check units, e.g. check bits, may be units, e.g. bits, of a code word of a second error detecting/error correcting code.

In a first operations mode, the data units, e.g. the data bits, which may be required for a given task, and the corresponding first check units, e.g. the first check bits, may be read from addresses of the memory device, wherein the addresses may be determined according to a task to be fulfilled. If an error that is correctable by applying the first code is present in the read data units, the error may be corrected using the first code, and the data units may be provided for further use.

In a second operations mode, the data units, e.g. the data bits, and the corresponding second check units, e.g. the second check bits, may be read from a predefined subset of $\tau$ addresses of the memory device (for $\tau \geq 1$). If an error that is correctable by applying the second code is present in the read data units, the data units may be corrected and may be written back to corresponding memory cells, wherein the first code may include different code words than the second code. Hereby, values that may have been erroneous in the memory cells before the read process may be written correctly to memory cells after the correction.

In various embodiments, a memory device may be operated in two different operating modes, wherein the memory device may be operated in one of the two different operating modes with one of two different codes, and may be operated in the other operating mode with the other code. The operating modes may include a first operations mode of writing, storing and reading, which may be referred to as a normal use, and a second operating mode may be used for restoring erroneous units in memory cells corresponding to an addressed area. The memory device may be an MRAM device.

In various embodiments, the corrected data units, e.g. data bits, may be written to the same address of the memory cells in the memory device from which the data units to be corrected have been read.

In various embodiments, in the first operations mode, when the data units may be provided for further use, if at least one error that may be corrected using the first code is present in the data units, the corrected data units may be written back to the memory cells. In various embodiments, by applying the first code, erroneous data units and erroneous check units may be corrected.

In various embodiments, in the second operations mode, in addition to the data units and the second check units corresponding to the data units, the first check units may be used for the error correction.

In various embodiments, by applying the first code, an error position (a so-called erasure) may be determined, and by applying the second code, a correction value may be determined using the error position.

In various embodiments, a further operations mode for restoring correct contents of the memory cells may be provided, wherein the data units and further check units of a further error correcting code may be stored in memory cells of the memory device, and when the data units and the further check units are read from the memory cells and an error that is correctable using the additional code is present in the read data units, the data units may be corrected using the additional code and may be written to corresponding memory cells.

In various embodiments, the predefined subset of addresses may be addresses of an address area (e.g. a contiguous address area), or a subset including all addresses of the addressable memory device.

In various embodiments, the memory device may be an MRAM, a flash memory device, or any other suitable non-volatile memory device (NVRAM). In various embodiments, after reading data units corresponding to $T_1$ addresses from the memory device, or after writing data units and corresponding first check units to $T_2$ addresses of the memory device, the second check bits may be formed and written to memory cells of the memory device, wherein $T_1+T_2>1$.

In various embodiments, in addition to the first operations mode and the second operations mode, an inactive state may be present, in which no units, e.g. bits, may be read from the memory divide, and no units, e.g. bits, may be written to the memory device. In various embodiments, after the inactive state ends, data units corresponding to addresses of an address region or a subset of addresses may be read, wherein, if an error that is correctable by applying the first code is present in the read data units, the error may be corrected using the first code, and the corrected data units may be written to corresponding memory cells of the memory device, and if an error that is not correctable by applying the first code and that is correctable by applying the second code is present in the read data units, the error may be corrected using the second code, and the corrected data units may be written to corresponding memory cells of the memory device.

In various embodiments, third check units, e.g. third check bits, may be formed using the first check units and/or the second check units, such that the first check units and/or the second check units and the corresponding third check units may be code words of an error detecting and/or error correcting check code.

In various embodiments, the data units, the address units and/or units, e.g. bits, derived from the address units may be units, e.g. bits, of a code word of the first code or of a code word of the second code.

In various embodiments, erroneous data units that may be read from an address a of the addressable memory device and that may be corrected by applying the first code and/or by applying the second code may be written to an address of the memory device that may be different from a.

In various embodiments, the first code may be a Hamming code, a shortened Hamming code, a Hsiao code, a shortened Hsiao code, a t-bit-error correcting BCH code, a shortened t-bit-error correcting BCH code, for example with $t\geq 2$, a Reed-Muller-Code, a shortened Reed-Muller-Code, a cyclic code, a shortened cyclic code, a byte-correcting code or a low-density parity code.

In various embodiments, the second code may be a parity code, a Hamming code, a shortened Hamming code, a Hsiao code, a shortened Hsiao code, a t-bit-error correcting BCH code, a shortened t-bit-error correcting BCH code, for example with $t\geq 2$, a Reed-Muller-Code, a shortened Reed-Muller-Code, a cyclic code, a shortened cyclic code, a Reed-Solomon-Code, a shortened Reed-Solomon-Code, a modified Reed-Solomon-Code, and a byte-correcting code or a low-density parity code or a RAID-code.

In various embodiments, also other suitable codes may be used as the first code and/or as the second code, for example a non-linear code, or a convolutional code.

In various embodiments, the erroneous data units that may be read from the addressable memory device and that may be corrected using the first code and/or the second code may be written to memory cells of a further memory device, wherein the further memory device may be different from the addressable memory device from which the erroneous data units were read.

In various embodiments, the further memory device may be an MRAM, an SRAM or a flash memory device.

In various embodiments, an update of the second check units may be performed, in other words, the second check units may be formed again and may be written again to the memory cells of the memory device, if, during the first operations mode, data units $D_a$ may be written to memory cells of the addressable memory device under an address a, and if the data units $D_a$ differ from error-free data units, e.g. data bits, $d_a$ that may have been present, e.g. stored, in the corresponding memory cells before the writing of the data units $D_a$.

In various embodiments, an update of the second check units, and/or additional check units, may be performed before the memory device is used in the second operations mode.

In various embodiments, an update of the second check units, and/or of additional check units, may be performed before the memory device is transferred into the inactive state.

In various embodiments, the inactive state may be ended, data units may be read from the memory device, the data units may be corrected using the first code, the second code, and possibly a further code, the corrected units may be written, e.g. written back, to the memory cells of the memory device, and the memory device may be sent back to the inactive state after the writing of the corrected data units to the memory cells, thereby restoring correct values of the memory cells.

In various embodiments, the first code may be a t-bit-error correcting code. In a case of a μ-bit-error occurring, corrected data bits may be written, e.g. written back, to the memory device if $\sigma\leq\mu\leq t$, and the corrected data bits may not be written to the memory device if $\mu<\sigma$, wherein σ may be a constant with $0<\sigma\leq t$ and $t\geq 2$. In various embodiments, the constant may be specified, e.g. by a user of the memory device.

In various embodiments, the memory device may, after a start-up, be operated in the second operations mode before the memory device may be operated in the first operations mode.

For error-detection and error correction error syndroms or a syndrome may be determined. If no error occurred, the corresponding error syndrome is equal to 0. If the error syndrome is not equal to 0, an error occurred.

The first code Cod1 may, in various embodiments, be used for an error correction, for an error detection, and simultaneously for error correction and for error detection, as described below.

In a first operations mode, the first code Cod1 may be predominately used for an error correction. It may happen that a non-correctable error is detected, for example in a case of an error being mapped to an error syndrome that does not correspond to a correctable error. This may for example be the case if the code is a shortened code, or if an additional parity bit is a check bit of the code.

An application of a second code Cod2 in a second operations mode and applying the first code Cod1 will be described below.

In various embodiments, during a reading of a potentially erroneous word υ' stored at an address a, the error syndrome s(υ') of the first code Cod1 may be used if a correction is applied using the error syndrome.

In various embodiments, other correction methods, for example a majority vote error correction, may be used.

In various embodiments, if s(υ')=0, υ' is a code word of the first code Cod1, and it may be assumed that υ' is error-free, it may be obsolete to correct it using the second code Cod2.

If s(υ')≠0, υ' may be marked as an erasure for an error correction by applying the second code Cod2. For the correction using the second Cod2, positions for an error correction may thus be already known, such that an erasure-correction may be applied, which may be an advantage over a correction in which an error position is unknown.

In various embodiments, if the correction uses the error syndrome, a first subset of components of the error syndrome of the first code Cod1 may be used for the error correction, and a second subset of components of the error syndrome of the first code Cod1 may be used for error detection, as described below. The subset of components of the error syndrome of the first code Cod1 used for error detection may include at least two components.

When reading the word υ', the error syndrome s(υ') may be formed, wherein $$s(υ')=s_1(υ'),s_2(υ'),\ldots,s_M(υ'),s_{M+1}(υ'),\ldots,s_L(υ'),$$

wherein it may be assumed that the error syndrome is an L-component vector including M first components $s_1(υ')$, $s_2(υ'), \ldots, s_M(υ')$ and (L−M) second components $s_{M+1}(υ')$, $s_{M+2}(υ'), \ldots, s_L(υ')$, wherein M<L and L−M≥2.

An error correction of the word υ' may be performed using the first components $s_1(υ'), s_2(υ'), \ldots, s_M(υ')$.

If $s_1(υ'), s_2(υ'), \ldots, s_M(υ')$≠0, then υ' may be corrected to $$υ^{corC_1} = υ' + e^{corC_1}$$

wherein a correction vector $e^{corC_1}$ may be determined by the first component $s_1(υ'), s_2(υ'), \ldots, s_M(υ')$ of the error syndrome s(υ').

For the corrected word $υ^{corC_1}$, which has been corrected using the first components of the error syndrome, for the first code Cod1, the second components of the error syndrome $$s_{M+1}(υ^{corC_1}), \ldots, s_L(υ^{corC_1}),$$

may be formed.

If $s_{M+1}(υ^{corC_1}), \ldots, s_L(υ^{corC_1})$=0, the correction of υ' to $υ^{corC_1}$ may be consideredas successful.

A further correction by the second code Cod2 may be omitted.

If $s_{M+1}(υ^{corC_1}), \ldots, s_L(υ^{corC_1})$≠0 even after the correction of υ' to $υ^{corC_1}$, an error may be present in $υ^{corC_1}$, and $υ^{corC_1}$ may be markedas an erasure.

In this case, in various embodiments, the original uncorrected value υ' may be restored and marked as an erasure.

For a better understanding, an example for the described method of a t-bit-error-correcting BCH-code over a Galois field $GF(2^m)$ will be given below. In the example, t=4.

An H-matrix of a 4-bit-error correcting BCH-code may be represented as $$H = \begin{pmatrix} H_1 \\ H_3 \\ H_5 \\ H_7 \end{pmatrix}$$

with $$H_1 = (\alpha^0, \alpha^1, \ldots, \alpha^{n-1}),$$
$$H_3 = (\alpha^0, (\alpha^1)^3, \ldots, (\alpha^{n-1})^3),$$
$$H_5 = (\alpha^0, (\alpha^1)^5, \ldots, (\alpha^{n-1})^5),$$
$$H_7 = (\alpha^0, (\alpha^1)^7, \ldots, (\alpha^{n-1})^7),$$

as for example shown in Lin, S. and Costello, D., "Error Control Coding", Prentice Hall, 1983, page 148.

Herein, for simplicity, α may be selected to be a primitive element of the Galois field $GF(2^m)$. A respective exponent j of $\alpha^j$ is to be understood as modulo $2^m-1$.

If $\alpha^j$, in its vector representation, is selected as an m-component binary column vector, $H_1, H_3, H_5$ and $H_7$ may each be binary (m,n)-matrices, and H may be a (4·m, n)-matrix.

The error syndrome s(υ') of a potentially erroneous vector $υ'=υ'_1, \ldots, υ'_n$ may be determined to be a 4·m-component binary vector $$s(υ')=H \cdot υ'^T = s_1(υ'), \ldots, s_M(υ'), s_{M+1}(υ'), \ldots, s_{4 \cdot m}(υ')$$

wherein $υ'^T$ may be the transposed column vector of the row vector υ'.

The respective m-component partial syndromes $s^1(υ')$, $s^3(υ'), s^5(υ'), s^7(υ')$ $$s^1(υ') = H_1 \cdot υ'^T$$

$$s^3(υ') = H_3 \cdot υ'^T$$

$$s^5(υ') = H_5 \cdot υ'^T$$

$$s^7(υ') = H_7 \cdot υ'^T$$

may be assigned to the submatrices $H_1, H_3, H_5$ and $H_7$.

A relation between the partial syndromes $s^1(υ'), s^3(υ')$, $s^5(υ'), s^7(υ')$ and the error syndrome s(υ') may be $$s(υ') = s^1(υ'), s^3(υ'), s^5(υ'), s^7(υ') = s_1(υ'), \ldots, s_{4 \cdot m}(υ'),$$

such that the first m, components of s(υ') may form the partial syndrome $s^1(υ')$. The respective subsequent m components may form the partial syndromes $s^3(υ'), s^5(υ'), s^7(υ')$.

After reading υ' from the memory device, the first partial syndrome $s_1(υ') = H_1 \cdot υ'^T$ may be formed and be used for correcting υ', whereas the partial syndromes $s^3(υ'), s^5(υ'), s^7(υ')$ may be not used for the error correction of υ'.

From the partial syndrome $s_1(υ')$, an n-component correction vector $e(s_1, C_1)$ may be determined, and the read vector υ' may be corrected to $$υ^{cor,s_1,C_1} = υ' + e(s_1, C_1)$$

wherein + refers to a component-wise addition modulo 2 or the logical XOR-operation. The error correction may be performed using the submatrix $H_1$ of the BCH-code, the m-dimensional column vectors $\alpha^0, \alpha^1, \ldots, \alpha^{n-1}$ of which may all be pairwise different. Every 1-bit-error may thus be assigned a different partial syndrome $s_1(υ')$, wherein a 1-bit error at the position i corresponds to the partial syndrome $s_1 = \alpha^i$ with the correction vector $$e(s_1, C_1) = (\underbrace{0, \ldots, 0}_{i-1}, 1, 0, \ldots, 0)$$
$$\phantom{e(s_1, C_1) = (0, \ldots, 0, 1, 0, \ldots, 0)}_{n}$$

In a case of a 1-bit-error being present in the read word $v'$, the read word may be corrected to the error free word $v^{cor,s_1,C_1} = v' + e(s_1, C_1)$, and $$s(v^{cor,s_1,C_1}) = H \cdot [v^{cor,s_1,C_1}]^T = 0$$

and thus $$s^1(v^{cor,s_1,C_1}) = H_1 \cdot [v^{cor,s_1,C_1}]^T = 0,$$

$$s^3(v^{cor,s_1,C_1}) = H_3 \cdot [v^{cor,s_1,C_1}]^T = 0,$$

$$s^5(v^{cor,s_1,C_1}) = H_5 \cdot [v^{cor,s_1,C_1}]^T = 0,$$

$$s^7(v^{cor,s_1,C_1}) = H_7 \cdot [v^{cor,s_1,C_1}]^T = 0,$$

In a case of a $\tau$-bit-error being present in $v'$, with $1 < \tau \leq 4$, using $s^1(v')$, a single bit may be corrected, and the correction may be erroneous.

In that case, $$s^1(v^{cor,s_1,C_1}) = H_1 \cdot [v^{cor,s_1,C_1}]^T = 0,$$

and at least one of the partial syndromes $$s^3(v^{cor,s_1,C_1}) = H_3 \cdot [v^{cor,s_1,C_1}]^T = 0,$$

$$s^5(v^{cor,s_1,C_1}) = H_5 \cdot [v^{cor,s_1,C_1}]^T = 0,$$

$$s^7(v^{cor,s_1,C_1}) = H_7 \cdot [v^{cor,s_1,C_1}]^T = 0,$$

may be different from 0. If at least one of these partial syndromes is different from 0, the correction of a single bit, which was performed based on $s^1(v')$, was erroneous, and the resulting value $v^{cor,s_1,C_1}$ may be marked as an erasure for a correction applying the second code $C_2$.

In various embodiments, the value $v'$ may be restored and $v'$ may be marked as an erasure for a correction applying the second code $C_2$. If all partial syndromes $s^3 (v^{cor,s_1,C_1})$, $s^5(v^{cor,s_1,C_1})$, $s^7(v^{cor,s_1,C_1})$ are 0, a correction of $v^{cor,s_1,C_1}$ by applying the secondcode $C_2$ may be obsolete.

If it may be assumed that 1-bit-errors occur more frequently than multiple-bit-errors, most of the errors, may be corrected during the read by using $s^1$ of the error syndrome of the first code $C_1$, and only relatively few errors, marked as erasure, may have to be corrected by applying the second code $C_2$.

In various embodiments, in the first operations mode, the first code $C_1$ may be used as a t-bit-error correcting code with t=4.

In various embodiments, two partial syndromes, for example $s^1(v')$ and $s^3(v')$, may be used for an error correction of up to 2-bit-errors and to determine a corresponding correction vector $e(s^1, s^3, C_1)$, and to form a correction vector $$v^{cor,s^1,s^3,C_1} = v' + e(s^1, s^3, C_1)$$

If $s^5 (v^{cor,s^1,s^3,C_1})=0$ and $s^7 (v^{cor,s^1,s^3,C_1})=0$, the correction may be considered successful.

If $s^5 (v^{cor,s^1,s^3,C_1})$ or $s^7(v^{cor,s^1,s^3,C_1}$ is different from 0, then $v^{cor,s^1,s^3,C_1}$ or $v'$ may be marked as an erasure for a correction with the second code $C_2$.

In rare cases of a multiple-bit-error being present, it may occur, that after a correction of a single bit using only the partial syndrome $s^1(v')$, the error syndrome of the correction vector $s(v^{cor,s^1,s^3,C_1})=H \cdot [v^{cor,s^1,s^3,C_1}]^T$ may be 0 for all partial syndromes, even though the correction was unsuccessful.

If, for example, the code distance of the first code $C_1$ is 9, as may be the case for a 4-bit-error correcting BCH-code, and an 8-bit-error is present in the data, an erroneous correction of a 1-bit-error may result in a 9-bit-error, which may lead to an erroneous code word, which may have an error syndrome of 0, and which may not be recognized as erroneous by applying the first code $C_1$.

If, in various embodiments, a probability of an 8-bit-error occurring in $v'$ is insignificantly small, this possibility may be ignored. If, however, this probability is intolerable, in various embodiments, for the first code $C_1$, additional syndrome components may be provided. In various embodiments, to the original H-matrix of the 4-bit-error correcting BCH-codes, a submatrix $H_9$ may be added, such that a H-matrix $$H = \begin{pmatrix} H_1 \\ H_3 \\ H_5 \\ H_7 \\ H_9 \end{pmatrix}$$

with $$H_9 = (\alpha^0, (\alpha^1)^9, \ldots, (\alpha^{n-1})^9),$$

may result. The submatrix $H_9$ may be an (m,n)-matrix with 9 rows. In various embodiments, them syndrome components $s_9(v') = H_9 \cdot v'^T$ may be used for error detection only, also in the first operations mode.

In various embodiments, a $(m_1, n)$-submatrix $H_9^*$, consisting of a subset of rows of the submatrix $H_9$, may be added. To enlarge the code distance or the distance of a code by one it is possible to add a parity bit by adding an additional row of n ones to the H-Matrix H.

FIG. 1A shows, in accordance with various embodiments, a schematic representation 100 of data bits and first and second check bits of a first code and of a second code, respectively, assigned to memory cells of a memory device.

FIG. 1A shows an addressable memory device, in which are stored, at an address $a^1=a_1^1, \ldots, a_l^1$, data bits $d^1=d_1^1, \ldots, d_k^1$ in memory cells 11, and first check bits $c^1(d^1)=c_1^2, \ldots, c_m^2$ determined from the data bits $d^1$ in memory cells 11', at an address $a^2=a_1^2, \ldots, a_l^2$, data bits $d^2=d_1^2, \ldots, d_k^2$ in memory cells 12 and first check bits $c^2(d^2)=c_1^1, \ldots, c_m^1$ determined from data bits $d^2$ in memory cells 12', ..., at an address $a^N=a_1^N, \ldots, a_l^N$, data bits $d^N=d_1^N, \ldots, d_k^N$ in memory cells 1N, and first check bits $c^N(d^N)=C_1^N, \ldots, c_m^N$ determined from data bits $d^N$ in memory cells 1N'.

The addresses $a^1, a^2, \ldots, a^N$ are not shown in FIG. 1A.

For i=1, ..., N, in an error-free case, in this embodiment, the bits $c^i, d^i=, c_1^i, \ldots, c_m^i, d_1^i, \ldots d_k^i$ may be bits of an error detecting/error correcting code Cod1.

Furthermore, in this embodiment, check bits $\gamma(d^1, d^2, \ldots, d^N)$ are stored in memory cells 13. The check bits $\gamma(d^1, d^2, \ldots, d^N)$ may be determined from the data bits $d^1, d^2, \ldots, d^N$. In various embodiments, these check bits may be stored at one or more addresses in respective further memory cells of the memory device.

In an error-free case, in this embodiment, the bits $d^1, d^2, \ldots, d^N, \gamma(d^1, d^2, \ldots, d^N)$ may be bits of an error detecting/error correcting code Cod2.

In a first operations mode, addresses $a^{i_1}, a^{i_1}, \ldots, a^{i_L}$ may be assigned to the memory device, and the respective potentially erroneous (which may also be referred to as defective or corrupt) data bits and first check bits $[d^{i_1}, c^{i_1}]$, $[d^{i_2}, c^{i_2}], \ldots, [d^{i_L}, c^{i_L}]$ may be read from these addresses. In a case of an error occurring for $i_j$, j=1, ..., L in the data bits $d^{i_j}$ that may be corrected using the check bits $c^{i_j}$ and by applying the code Cod1, the erroneous data bits $d^{i_j}$ may be corrected to the correct data bits $d^{ij,cor}=d^{ij}$ and may be provided at an output of the addressable memory device.

In a second operations mode, in this embodiment, addresses $a^1, \ldots, a^N$ of the addressable memory device may be assigned, at which the data bits $d^1, \ldots, d^N$ and the corresponding first check bits $c^1, \ldots, c^N$ may be stored. The addresses $a^1, \ldots, a^N$ may form an address area.

For $i=1, \ldots, N$, at the address $a^i$, the potentially erroneous data bits $d^{i\prime}$ and the potentially erroneous respective first check bits $c^{i\prime}$ may be read from the memory device. In a case of the read bits $d^{i\prime}$, $c^{i\prime}$ forming a code word of the code Cod1, it may be assumed that no error is present. No correction is performed, and the read bits $d^{i\prime}$, $c^{i\prime}$ are not written back to memory cells.

In a case of the read bits $d^{i\prime}$, $c^{i\prime}$ being erroneous, and if the error may be corrected using the first code Cod1, the data bits $d^{i\prime}$ may be corrected to correct data bits $d_{cor}^{i}$ by applying the first code Cod1, and the corrected data bits $d_{cor}^{i}$ may be written to the memory device at the address $a^i$, such that the erroneous data bits $d^{i\prime}$ may be overwritten, i.e. replaced, by the corrected data bits $d_{cor}^{i}$.

In a case of the read bits $d^{i\prime}$, $c^{i\prime}$ being erroneous, and if the error cannot be corrected using the first code Cod1, addresses $a^1, \ldots, a^N$ of the addressable memory device may be assigned, and the data bits $d^{1\prime}, \ldots, d^{M}$ and the corresponding first check bits $c^{1\prime}, \ldots, c^{M}$ may be read.

For $i=1, \ldots, N$, the data bits $d^{i\prime}$, which are erroneous, and which are correctable by applying the first code Cod1, may be corrected by applying the first code Cod1 to form the corrected data bits $d_{cor}^{i}$. The corrected data bits $d_{cor}^{i}$ may be written to the memory device at the address $a^i$, such that the correctable erroneous data bits $d^{i\prime}$ may be overwritten by the corrected data bits $d_{cor}^{i}$.

In a case of the error in the data bits $d^{3\prime}$ not being correctable by the first code Cod1, and of the data bits $d^{2\prime}$, $d^{9\prime}$ and $d^{12\prime}$ being correctable by the first code Cod1, while all the other data bits may be correct, and if N=16, then, in the memory device, the data bits $d^1, d_{cor}^{2}, d^{3\prime}, d^4, \ldots, d^8, d_{cor}^{9}, d^{10}, d^{11}, d_{cor}^{12}, d^{13}, \ldots, d^{16}$ may be stored at the addresses $a^1, \ldots, a^{16}$. The erroneous word $d^1, d_{cor}^{2}, d^{3\prime}, d^4, \ldots, d^8, d_{cor}^{9}, d^{10}, d^{11}, d_{cor}^{12}, d^{13}, \ldots, d^{16}, \gamma\prime$ may now be corrected by applying the second code Cod2 to the code word $d^1, d_{cor}^{2}, d_{cor}^{3}, d^4, \ldots, d^8, d_{cor}^{9}, d^{10}, d^{11}, d_{cor}^{12}, d^{13}, \ldots, d^{16}, \gamma$ if the error present in the data bits $d^3$ in $d^{3\prime}$ is correctable by applying the second code Cod2.

If the error is correctable, the corrected data bits $d_{cor}^{3}$ that have been formed by applying the second code Cod2 may be written to the address $a^3$ of the memory device. First check bits $c^3$ may be formed from the corrected data bits $d_{cor}^{3}$, which may also be stored at, e.g. written to, the address $a^3$ of the addressable memory device.

In various embodiments, many different possibilities for an application of different codes may exist.

In an exemplary embodiment, it may be possible, in the second operations mode, to apply the second code Cod2 for error correction.

In an exemplary embodiment, it may be possible, in the second operations mode, to first apply the first code Cod1 for error detection, i.e. for the determination of error positions or erasures, and subsequently to apply the second code Cod2 to correct erasures.

In an exemplary embodiment, it may be possible to first apply the second code Code2 for error correction and subsequently to apply the code Cod1 for error correction of remaining not by the code Cod2 corrected errors.

In an exemplary embodiment, it may be possible to firstly apply the code Cod1, subsequently to apply the code Code2, and again to apply the code Cod1.

In an exemplary embodiment, it may be possible to additionally apply a third code or several codes in various combinations.

In an exemplary embodiment, it may be possible, in a mode of operation, to first apply a code C partially for error correction and partially for error detection and subsequently to apply another code C' for error correction for the not by the code C corrected errors. If the positions of the not corrected by the code C errors are determined, it may be possible to utilize the positions of the detected and not corrected errors for correcting these errors by the code C' as erasures.

FIG. 1B shows, in accordance with various embodiments, a schematic representation 101 of data bits, first and second check bits of a first code and of a second code, respectively, and additional check bits, assigned to memory cells of a memory device, wherein the additional check bits may further secure an integrity of the second check bits.

FIG. 1B shows that the second check bits $\gamma(d^1, \ldots, d^N)$ may be supplemented by third check bits $c(\gamma)$, such that $\gamma(d^1, \ldots, d^N), c(\gamma)$ may form a code word of a third error detecting/error correcting code $C_{check}$ In FIG. 1B, the third check bits are stored in memory cells 14 at an address $a^{N+2}$, while the second check bits $\gamma(d^1, \ldots, d^N)$ are stored in memory cells 13 at an address $a^{N+1}$. If the second check bits are used for an error correction of data bits, the third check bits may be used for checking if the second check bits are erroneous. If the second check bits are erroneous, and if the error in the second check bits can be corrected by using the third check bits, the second check bits are corrected by applying the third code $C_{check}$. Thereafter, the corrected second check bits may be used for correcting potentially erroneous data bits by applying the second code Cod2. Apart from this, FIG. 1B is not different from FIG. 1, such that a repetition of the description is omitted.

In various embodiments, the first check bits may be check bits of a Hsiao-code, which may be known to a person skilled in the art. For $i=1, \ldots, N$, the bits $d^i, c^i$ may each form a code word of a Hsiao-code, which may allow a correction of a 1-bit-error, and a detection of a 2-bit-error.

In various embodiments, the second check bits may be check bits of a t-bit-error-correcting BCH-code. For example, t=3, t=20, or any other suitable value.

In various embodiments, the first check bits may be check bits of a 2-bit-error-correcting and 3-bit-error-detecting BCH-code. For $i=1, \ldots, N$, each of the bits $d^i, c^i$ forms a code word of a 2-bit-error-correcting, 3-bit-error-detecting BCH-code.

In various embodiments, the second check bits may be check bits of a 3-bit-error-correcting BCH-code, which may be known to a person skilled in the art.

In an error-free case, each of the bits $d^1, d^2, \ldots, d^N$, $\gamma(d^1, \ldots, d^N)$ may form a code word of a 3-bit-error-correcting BCH-code.

In various embodiments, the first check bits $c^1, \ldots, c^N$ may be used for forming the second check bits.

In an error-free case, each of the bits $d^1, c^1, d^2, c^2, \ldots, d^N, c^N, \gamma(d^1, c^1, \ldots, d^N, c^N)$ may be a code word of a code, wherein a 3-bit-error-correcting BCH-code is used as an example.

In various embodiments, the bits
$d^1, d^2, \ldots, d^N, \gamma(d^1, \ldots, d^N)$
or the bits
$d^1, c^1, d^2, c^2, \ldots, d^N, c^N, \gamma(d^1, c^1, \ldots, d^N, c^N)$
may form code words of a byte-correcting second code Cod2, for example a Reed-Solomon-code, which may be known to a person skilled in the art, wherein a length of a byte may be equal to the number of data bits $d^i$ or to a number of a combination of the data bits and the check bits $d^i, c^i$.

In various embodiments, a plurality of data bits and a plurality of check bits may be combined to form a byte, for example bits of the data bits $d^1, d^2$ or bits of the data bits and the check bits $d^1, c^1, d^2, c^2$.

In various embodiments, a portion of the data bits $d^i$ may form a byte. If, for example, a data word includes 64 bit, a byte may for example include 8 bits, such that a data word may include 8 bytes.

In various embodiments, in addition to the data bits, address bits may be used for forming check bits. The following cases may serve as examples.

In an error-free case, for $i=1, \ldots, N$ bits $d^i, a_s^i, c^i$, when written to an address $a_s^i$, may form a code word of an error correcting first code Cod1, and $d^i, a_l^i, c^i$, when read from the address $a_l^i$, may form a code word of the first code Cod1, wherein a write address $a_s^i$ may be supplied by an address generator during a process of writing to a memory device, and a read address u $a_l^i$ may also be supplied by the address generator during a process of reading from the memory device. In the error-free case, $a_s^i = a_l^i$. Address bits may be included in different ways in a forming of code words, for example of code words of the second code Cod2.

In various embodiments, the bits
$d^1, \ldots, d^N, \gamma(d^1, \ldots, d^N)$
may form a code word of the second code Cod2.

In various embodiments, the bits
$d^1, c^1, \ldots, d^N c^N, \gamma(d^1, c^1, \ldots, d^N, c^N)$
may form a code word of the second code Cod2.

In various embodiments, the bits
$d^1, a^1, \ldots, d^N, a^N, \gamma(d^1, a^1, \ldots, d^N, a^N)$
may form a code word of the second code Cod2.

In various embodiments, the bits
$d^1, a^1, c^1, \ldots, d^N, a^N, c^N, \gamma(d^1, a^1, c^1, \ldots, d^N, a^N, c^N)$
may form a code word of the second code Cod2.

In various embodiments, the bits
$d^1, f(a^1), c^1, \ldots, d^N, f(a^N), c^N, \gamma(d^1, a^1, c^1, \ldots, d^N, a^N, c^N)$
may form a code word of the second code Cod2, wherein $f(a^i)$ may be bits derived from the address bits. For example, it may be that $f(a^i) = a_1^i + a_2^i + \ldots, + a_l^i = P(a^i)$, wherein $P(a^i)$ may be a parity of the address bit, and + may be an addition modulo 2.

In the following example, the second code Cod2 may be a byte-correcting code, wherein a byte may for example be formed by the bits $d^i, a^i$, and wherein
$d^1, a^1, d^2, a^2, \ldots, d^N, a^N, \gamma(d^1, a^1, \ldots, d^N, a^N)$ In an error-free case, a code word of the second code Cod2 is a code word formed by the data bits $[d^1, a^1], [d^2, a^2], \ldots, [d^N, a^N]$ and the check bits $\gamma(d^1, a^1, \ldots, d^N, a^N)$.

It may be surprising that in this case, not only a detection of an address error, but also a correction may be possible. If for example an assigned read address $a^2$ is erroneous and forms $a^{2*}$, the memory device may not provide data bits $d^2$ stored at the address $a^2$ but data bits $d^{2*}$ stored at the address $a^{2*}$. If $d^2 \neq d^{2*}$, then
$d^1, a^1, d^{2*}, a^{2*}, \ldots, d^N, a^N, \gamma(d^1, a^1, \ldots, d^N, a^N)$
is not a code word of the second code Cod2. If an error occurs, the error is a correctable error of the second code Cod2, if the second code Cod2 is at least a 1-byte-correcting code. The not-code-word
$d^1, a^1, d^{2*}, a^{2*}, \ldots, d^N, a^N, \gamma(d^1, a^1, \ldots, d^N, a^N)$
may be corrected by applying the second code Cod2 to form the error-free code word
$d^1, a^1, d_{cor}^{2*} = d^2, a_{cor}^{2*} = a^2, \ldots, d^N, a^N, \gamma(d^1, a^1, \ldots, d^N, a^N)$
such that the error is corrected and the correct data bits $d^2$, which are stored at the address $a^2$ in the memory device may be provided, even though the erroneous address $a^{2*}$ had been assigned to the memory device.

Various examples for modes of operation of a memory device will now be described.

A memory device may be operated in a first operations mode. From $T_1$ addresses $a^{i1}, a^{i2}, \ldots, a^{iT1}$, data bits $d^{i1}_1, d^{i1}_2, \ldots, d^{i1}_{T1}$ and corresponding first check bits $c^{i1}_1, c^{i1}_2, \ldots, c^{i1}_{T1}$ of the first code Cod1 may be read from the memory device. In a case of one or more errors being present in the data bits, which may be correctably by applying the first code Cod1, the data bits $d^{i1}_1, d^{i1}_2, \ldots, d^{i1}_{T1}$ may be corrected using the first code Cod1 and may be provided by the memory device at its data output.

To $T_2$ addresses $a^{j1}, a^{j2}, \ldots, a^{jT2}$, data bits $d^{j1}, d^{j2}, \ldots, d^{jT2}$ and corresponding first check bits $c^{j1}, c^{j2}, \ldots, c^{jT2}$ of the first code Cod1 may be written to the memory device.

In various embodiments, after $T_1$ data have been read from and after $T_2$ data have been written to the memory device, it may be possible to use the data bits stored in memory cells of the memory device for forming second check bits of the first code Cod1 $\gamma(d^1, c^1, \ldots, d^N, c^N)$ and of the second code Cod2, and to enter an inactive phase.

In various embodiments, at certain points in time $t_1, t_2, \ldots, t_M$, the data bits stored in the memory cells at this point in time may be used for forming second check bits $\gamma(d^1, \ldots, d^N)$ of the code Cod2 and to enter an inactive phase.

In various embodiments, at certain points in time $t_1, t_2, \ldots, t_M$, the data bits and the first check bits of the code Cod1 stored in the memory cells at this point in time may be used for forming second check bits $\gamma(d^1, c^1 \ldots, d^N, c^N)$ of the second code Cod2 and to enter an inactive phase.

In various embodiments, if, after a certain duration, the inactive phase is ended, the addresses $a^1, \ldots, a^N$, at which the potentially erroneous data bits $d^{1\prime}, \ldots, d^{N\prime}$ and the corresponding potentially erroneous check bits $c^{1\prime}, \ldots, c^{N\prime}$ of the code Cod1 are stored, may be assigned, and the read bits $d^{1\prime}, c^{1\prime}, \ldots, d^{N\prime}, c^{N\prime}$ may be corrected by applying the first code Cod1 if the one or more errors is/are correctable by the first code Cod1. The corrected bits may be written back to the corresponding memory cells.

For example, if an error occurs in $d^{j\prime}, c^{j\prime}$ that is not correctable by applying the first code Cod1, but which may be detected by applying the first code Cod1, the bits $d^{j\prime}, c^{j\prime}$ are not corrected using the first code Cod1.

In various embodiments, if the error is correctable by applying the second code Cod2, the bits $d^{j\prime}, c^{j\prime}$ may be corrected by applying the second code Cod2 after the errors that are correctable by applying the first code Cod1 have been corrected and after the corrected bits have been written back to corresponding memory cells of the memory device.

In an example, a combination of data bits and check bits may include 256 data bits, which may form 16 groups of bits $d^1, \ldots, d^{16}$, each including 16 data bits $d^1=d_1^1, \ldots, d_{16}^1, \ldots, d^{16}=d_1^{16}, \ldots, d_{16}^{16}$, each of which being supplemented by 6 check bits $c^1=, c_1^1, \ldots, c_6^1, \ldots, c^{16}=c_1^{16} \ldots, c_6^{16}$ of a Hsiao-code, such that the first code Cod1 is a Hsiao-code with 16 information bits and 6 check bits.

As the second code Cod2, for example, a 2-bit-error correcting and 3-bit error detecting BCH-code with 256 information bits $d^1, \ldots, d^{16}$ and 19 check bits $c_1^{BCH}, \ldots, c_{19}^{BCM}$ may be used, wherein also a total parity forms a check bit $c_{19}^{BCM}$.

A Hsiao-code may correct all 1-bit errors and detect all 2-bit errors.

In a case of a bit error occurring in positions 10 and 20 of the data bits, the error in position 10 is corrected by the Hsiao-code Cod1 using the bits $d_1^1, \ldots d_{10}^{-1}, \ldots, d_{16}^1, \ldots, c_1^1, \ldots, c_6^1$.

The error in bit position 20 may also be corrected by the Hsiao-code Cod1 using the bits $d_1^2, \ldots d_4^{-2}, \ldots, d_{16}^2, \ldots, c_1^2, \ldots, c_6^2$.

If no further errors occur, a correction by applying the second code Cod2 may not be required.

If, for example, bit errors occur at positions 10 and 11, the errors may be detected by the first code Cod1 using the bits $d_1^1, \ldots d_{10}^{-1}, d_{11}^{-1}, \ldots, d_{16}^1, \ldots, c_1^1, \ldots, c_6^1$. However, they may not be corrected using the first code Cod1.

However, the errors may be corrected by using the 2-bit-error correcting and 3-bit-error-detecting BCH-code using the bits $d_1^1, \ldots d_{10}^{-1}, d_{11}^{-1}, \ldots, d_{16}^1, d_1^2, \ldots, d_{16}^2, \ldots, d_1^{16}, \ldots, d_{16}^{16}, c_1^{BCH}, c_{19}^{BCH}$.

wherein the corrected bits may be written back to the corresponding memory cells, such that a correct content of the memory cells may be restored.

In various embodiments, check bits $c_1^1, \ldots, c_6^1, \ldots, c_1^{16}, \ldots, c_6^{16}$ of the code Cod1 may be included in a correction by the second code Cod2. The code Cod2 may be a 2-bit-error correcting and 3-bit-error-detecting BCH-code with 256+96=352 information bits and 19 check bits, and the number of required check bits is not increased.

A coding process using Hsiao-codes or BCH-codes may be known to a person skilled in the art. The coding may be performed serially or in parallel.

In various embodiments, the second code Cod2 may be a byte-correcting code. A byte-correcting code may for example be a Reed-Solomon-code or a modified Reed-Solomon code, which may be known to the person skilled in the art.

In an example, 256 data bits may be considered, which may be formed by 16 groups of data bits $d^1, \ldots, d^{16}$ of 16 data bits each $d^1=d_1^1, \ldots, d_{16}^1, \ldots, d^{16}=d_1^{16}, \ldots, d_{16}^{16}$ and which may be supplemented by 6 check bits $c^1=c_1^1, \ldots, c_1^6, \ldots c^{16}=c_1^{16} \ldots, c_6^{16}$ of Hsiao-code each, such that the first code Cod1 is a Hsiao-code with 16 information bits and 6 check bits.

As a second code Cod2, a 1-byte-correcting Reed-Solomon-code may be used. As a byte size, 16 bit may be determined. The 16 data bytes may be referred to as $d^1, d^2, \ldots, d^{16}$. 32 check bits $c_1^B, \ldots, c_{32}^B$ may be used.

In a case of bit errors occurring in the data bits $d_2^{-1}, d_3^{-1}, d_5^{-1}, d_{10}^{-1}, d_3^{-2}, d_7^{-15}$, the bit errors $d_3^{-2}, d_7^{-15}$, may be corrected using the Hsiao-code Cod1, because there is just one error (a 1-bit-error) in each of the bytes $d^2$ and $d^{15}$. The corrected values that were corrected using the first code Cod1 may be written back to corresponding memory cells. The bit-errors of the first byte cannot be corrected using the Hsiao-code Cod1.

In a case of the error $d_2^{-1}, d_3^{-1}, d_5^{-1}, d_{10}^{-1}$ in the first byte $d^1$ being detected by the first code Cod1 as a non-correctable error, the first byte may be determined as an erasure or as an error position.

Applying the second code Cod2 when the error position is known only requires a determining of correction values 0110100001000000 for this first byte.

As a second code Cod2, a 2-byte-correcting Reed-Solomon code with a byte size of 8 bits may for example be used.

In various embodiments, using a first code Cod1 and a second code Cod2, in a start-up phase a correcting of data may in a first iteration apply the first code Cod1 for correcting the data bits, wherein the corrected data bits may be written back to the corresponding memory cells. Errors that are not correctable using the first code Cod1, but which can be corrected using the second code Cod2, are corrected by applying the second code Cod2 after the correction by applying the first code Cod1. Corrected bits that were corrected by applying the second code Cod2 may be written back to corresponding memory cells.

After a correction during a start-up phase, when entering a normal operations phase, an error correction may use only the first code Cod1.

In various embodiments, bits read in a normal operations mode may be corrected using the first code Cod1, and the corrected values may be not written back to the memory device.

In various embodiments, the corrected bits may be written back to the memory device.

If the first code Cod1 is a t-bit error correcting code with t>1, it is possible to correct the bits read in the normal operations mode by applying the first code Cod1. A treatment of the corrected errors may depend on, e.g., the number of corrected errors.

In various embodiments,

If a σ-bit-error is present with $1 \leq \sigma \leq \tau < t$ and $1 \leq \tau$, the corrected bits that were corrected using the first code Cod1 may be not written back to the memory device.

If a μ-bit-error is present with $\tau < \mu \leq t$, the corrected bits that were corrected using the first code Cod1 may be written back to the memory device.

If, for example, t=3, a 1-bit-error corrected by the first code Cod1 may be not written back to the memory device, but in a case of a corrected 2-bit error or a corrected 3-bit-error, the corrected bits may be written to the memory device. In this way, a number of write operations may be significantly reduced, since 2-bit errors and 3-bit-errors are much less frequent than 1-bit-errors.

In various embodiments, check bits of the second code Cod2 may be formed at an end of a normal operations mode, for example before entering an inactive mode. In various embodiments, the check bits of the second code Cod2, which may also be referred to as second check bits, may be updated during normal operations.

In various embodiments, the check bits of the second code Cod2 may be updated when data bits are newly written to memory cells. In various embodiments, the memory cells into which the new data bits are to be written may first be read, and the read data bits may be compared to the data bits to be written to the memory cell, for example using a component-wise XOR-operation. A difference between the data bits presently stored in the memory cells and the data bits to be stored may determine a modification of the check bits of the second code Cod2. In various embodiments, potentially erroneous read data bits may first be corrected using the first code Cod1 before determining the difference to the data bits that are to be written to memory.

In various embodiments, check bits of the second code Cod2 may be supplemented by check bits $c_1^{check}, \ldots, c_L^{check}$, such that the check bits of the second code Cod2 and the check bits $c_1^{check}, \ldots, c_L^{check}$, form a code word of an error correcting/error detecting code $C_{check}$.

In various embodiments, the code $C_{check}$ may be the first code Cod1. In that case, the check bits of the second code Cod2 may be corrected in a normal operations mode by applying the first code Cod1 if they are erroneous and the error(s) can be corrected using the first code Cod1.

In the following example, address bits may be implemented into an error correction.

In the example, 256 data bits may form 16 groups $d^1, \ldots, d^{16}$ of 16 data bits each $d^1=d_1^1, \ldots, d_{16}^1, \ldots d^{16}=d_1^{16}, \ldots, d_{16}^{16}$, which are stored at 16 addresses $a^1=00000, a^2=00001, \ldots, a^{16}=11111$, at which addresses are stored also the corresponding check bits $c^1=, c_1^1, \ldots, c_5^1$, $c^2=, c_1^2, \ldots, c_5^2, c^{16}=c_1^{16}, \ldots, c_5^{16}$ of a Hsiao-Code with 5 check bits used as the first code Cod1, such that $$[d^1, a^1, c^1], \ldots, [d^{16}, a^{16}, c^{16}]$$

are code words of a 1-bit-error correcting and 2-bit error detecting Hsiao-code. The 21 bits each $d^1, a^1, c^1, \ldots, d^{16}, a^{16}, c^{16}$ form a byte of a, for example, 1-byte-error correcting second code Cod2.

In various embodiments, in a second operations mode, which may for example be executed during a start-up, the following may be executed:

First, at the addresses $a^1, \ldots, a^{16}$, potentially erroneous data bits $d^{1t}, \ldots d^{16t}$ and their corresponding potentially erroneous check bits $c^{1t}, \ldots, c^{16t}$ may be read. While reading the data bits at the intended address $a^i$ mit $1 \leq i \leq 16$, an error may occur in one or more of the address bits, such that an erroneous address $a^{it}=a^j$ may be accessed, and the 21 bits $d^j, c^j$ may be read. Then, it may be tested whether $d^j, a^i, c^j$ is a code word of the first code Cod1. In a case of an error being present that is not correctable by the first code Cod1, $d^j, a^i, c^j$ may be marked as an erasure and may be corrected by applying the second code Cod2.

In various embodiments, if an error in an address bit, also referred to as an address error, is correctable by the first code Cod1, it may be determined from the correction signal for the address bits that an address error occurred, and that $d^j, a^i, c^j$ is an erasure.

FIG. 2 shows, in accordance with various embodiments, a schematic representation of data bits and check bits assigned to memory cells of a memory device for a block-wise organization of the storage device.

FIG. 2 shows a memory device including M+1 memory blocks. It should be noted that the memory blocks could also be distributed over a plurality of memory devices.

In the j-th memory device with N addresses $a^{1j}, \ldots, a^{Nj}$ of word width l, under every address $a^{ij}$, the k data bits $d^{ij}=d_1^{ij}, \ldots, d_k^{ij}$ may be stored in memory cells $2ij$. The corresponding m first check bits $c^{ij}=c_1^{ij}, \ldots, d_m^{ij}$ of the first code Cod1 may be stored under the same address $a^{ij}$ in memory cells $2ij'$, wherein $j=1 \ldots, M$.

The addresses of the memory cells are not indicated in FIG. 2.

Furthermore, in memory cells $2\gamma j$ of the j-th block Blockj, second check bits $\gamma^j(d^{1,j}, \ldots, d^{Nj})$ are stored.

Depending on a word width of $d^{ij}, c^{ij}$ and on the word width of $\gamma^j(d^{1,j}, \ldots, d^{Nj})$, the second check bits are stored at one or more addresses in the block Blockj.

In an error-free case, the bits $d^{ij}, c^{ij}$ form a code word of the first code Cod1, and the bits $d^{1j}, d^{2j}, \ldots, d^{Nj}, \gamma^j(d^{1,j}, \ldots, d^{Nj})$ form a code word of the second code Cod2.

In the memory cells $2i$D of the (M+1)-th block Block(M+1), the bits $D^i=D_1^i, \ldots, D_k^i$ are stored, whereas in the memory cells $2i$C the bits $c^i=C_1^i, \ldots, C_1^i$ are stored.

In further memory cells $2\Gamma$, the check bits $\gamma^{M+1}(D^1, \ldots, D^N)$ are stored.

In an error-free case, the bits $D^i, C^i$ form a code word of the first code Cod1 and the bits $D^1, \ldots, D^N, \gamma^{M+1}(D^1, \ldots, D^N)$ form a code word of the second code Cod2. The bits $D^1, \ldots, D^N$ are check bits of a further Cod3.

The bits $D^i$, for $i=1, \ldots, N$, are determined as $$D^i = D_1^i, \ldots D_k^i = \\ = (d_1^{i1}, \ldots, d_k^{i1}) \oplus (d_1^{i2}, \ldots, d_k^{i2}) \oplus \ldots \oplus \bigoplus (d_1^{iM}, \ldots, d_k^{iM})$$

wherein $\oplus$ represents a component-wise XOR-operation.

For example, for $D_1^1$
$D_1^1=d_1^{11} \oplus d_1^{12} \oplus \ldots \oplus d_1^{1M}=P(d_1^{11}, d_1^{12}, \ldots, d_1^{1M})$
and $D^1$ is the parity of the bits $d_1^{11}, d_1^{12}, \ldots, d_1^{1M}$.

In general,
$D_j^i=d_j^{i1} \oplus d_j^{i2} \oplus \ldots \oplus d_j^{iM}=P(d_j^{i1}, d_j^{i2}, \ldots, d_j^{iM})$
is the parity of the bits $d_1^{i1}, d_j^{i2}, \ldots, d_j^{iM}$, wherein these bits may be stored in different memory blocks.

In various embodiments, in a first operations mode, if potentially erroneous data bits $d^{ijt}$ and corresponding check bits $c^{ijt}$ are read from the j-th memory device block at an address that may be determined according to requirement, the data bits $d^{ijt}$ the data bits may be corrected using the first code Cod1 if the error is correctable by applying the first code Cod1.

In various embodiments, if the memory device is transferred into an inactive mode, which may also be referred to as inactive state or inactive phase, in which no read operations and no write operations may be performed, errors may form in the memory cells of the memory device during the inactive phase. In an MRAM-memory device, such errors may for example be generated by quantum effects.

In various embodiments, if the memory device is to be transferred to the first operations mode after having been in an inactive mode, as many as possible errors may be corrected in the memory cells of the memory device before a start of the first operations mode. In other words, before entering the first operations mode, as many as possible correct values of the bits stored in the memory cells may be written to the memory cells. In various embodiments, erroneous values, which for example may have accumulated during the inactive phase, may be overwritten with the correct values. For restoring the correct values, the first code and the second code may be applied.

In various embodiments, first all addresses of an address area of the first memory device block may be read, the potentially erroneous data bits and the first check bits corresponding to the read data bits may also be read, and if an error occurs in the read data that is correctable using the first code Cod1, the error may be corrected. The corrected data that were corrected applying the first code Cod1 may be written back to the memory device. The writing of the corrected data to the memory device may include forming check bits of the first code Cod1 using the corrected data bits, and writing, e.g. writing back, the check bits to the memory device, thereby restoring erroneous check bits to correct values.

In a case of no error being present in the read bits, it may be obsolete to write the read bits back to the memory device.

In various embodiments, if in the read data bits an error is present that is not correctable by applying the first code Cod1, the read bits may be not written back to the memory device, such that the bits that are not correctable by the first code Cod1 may remain stored in the memory device as erroneous bits.

In various embodiments, if in the first block Block1 one or more errors are present that may not be corrected by applying the first code Cod1 the erroneous data bits $d^{11\prime}, \ldots, d^{1N\prime}$ and the possibly erroneous check bits $\gamma'(d^{11}, \ldots, d^{1N})$ may be read, and the errors may be corrected by applying the second code Cod2 if the error is correctable by the second code Cod2. The corrected data bits may be written back to the corresponding memory cells. From the corrected data bits corrected first check bits may be determined and may be written to the memory device.

In various embodiments, from the corrected data bits, second check bits may be formed and written to the memory device.

In various embodiments, the same procedure may be applied to the blocks Block2 to BlockM.

In various embodiments, if an error is present for example in a block Block3 that may neither be corrected by the first code Cod1 nor by the second code Cod2, this error may be corrected using a third code Cod3 if only a single block, which herein is Block3, shows such an error. An arbitrary number of bits in the block Block3 may be erroneous. It may be known which of the blocks contains an error that is uncorrectable using the first code Cod1 and the second code Cod2.

For the data bits $d^{13}, d^{23}, \ldots, d^{N3}$ of the block $D^3$, the following may apply:

$$d^{13} = D^1 \oplus d^{11} \oplus d^{12} \oplus d^{14} \oplus \ldots \oplus d^{1(M+1)} \quad (1)$$
$$d^{23} = D^2 \oplus d^{21} \oplus d^{22} \oplus d^{24} \oplus \ldots \oplus d^{2(M+1)}$$
$$\vdots$$
$$d^{N3} = D^N \oplus d^{N1} \oplus d^{N2} \oplus d^{N4} \oplus \ldots \oplus d^{N(M+1)}$$

If only data bits, and possibly also check bits, of the block Block3 are erroneous, the erroneous bits $d^{13\prime}, d^{23\prime}, \ldots, d^{N3\prime}$ may be replaced by the corrected bits $d_{cor}^{13}, d_{cor}^{23}, \ldots, d_{cor}^{N3}$ with $$d_{cor}^{13} = D^1 \oplus d^{11} \oplus d^{12} \oplus d^{14} \oplus \ldots \oplus d^{1(M+1)} \quad (2)$$
$$d_{cor}^{23} = D^2 \oplus d^{21} \oplus d^{22} \oplus d^{24} \oplus \ldots \oplus d^{2(M+1)}$$
$$\vdots$$
$$d_{cor}^{N3} = D^N \oplus d^{N1} \oplus d^{N2} \oplus d^{N4} \oplus \ldots \oplus d^{N(M+1)}$$

Using the corrected data bits, the corresponding first check bits of the first code Cod1 and second check bits of the second code Cod2 may be formed.

Since the erroneous block may be known, the correction may be achieved by using just a single additional block. If more than one block is expected to be erroneous in an embodiment RAID-Codes as described for instance in Guillermo, Q A. at al. "Tolerating Multiple Failures in RAID Architectures with Optimal Storage and Uniform Declus-tering" pp. 161-172, in Jin, H., Cortes, T. and Buyya, R. (ed.) "High Performance Mass Storage and Parallel I/O", IEEE Press 2002, can be applied.

After a correction of the errors that may have been generated during the inactive mode, wherein the correction may have applied the first code, the second code, possibly the third code, Cod1, Cod2, Cod3 and possibly additional codes, the memory device may be transferred, e.g. returned, to the first operations mode.

The described correction for a restoring of correct values in the memory cells may for example be executed during a start-up.

In various embodiments, before a terminating of the first operations mode, for example before executing a shut-down of the memory device, e.g. before transferring the memory device to an inactive state, e.g. to a power-off-state, the first check bits (of the first code Cod1), the second check bits (of the second code Cod2), and the check bits of further codes that may be used, may be determined based on the data bits (and possibly on the first and/or second check bits and/or the address bits) stored in the memory device and may be written back to the respective memory cells for adapting the check bits to the values presently stored in the memory cells.

In various embodiments, if, in a first operations mode, data bits corrected using the first code Cod1 are written, e.g. written back, to the memory device, the second check bits (of the second code Cod2) may be updated upon an ending of the first operations mode. The newly determined second check bits may be written to respective memory cells (e.g., previous second check bits may be overwritten), because during write operations in the first operations mode data bits may have been written to the memory device that may require the update of the second check bits (of the second code Cod2). Similarly, further check bits, e.g. of a third code or a further code) may be updated. First check bits (of the first code Cod1) may in various embodiments be updated by writing the first check bits to the memory cells whenever data bits are written to the memory device during a first operations mode, or for example whenever a write process to the memory device modifies a value of a memory cell.

In various embodiments, an update of the second check bits and possibly of further check bits may be performed for every write process in the first operations mode. A change in the check bits, i.e. a difference between presently stored check bits and check bits to be written to the memory device, may be determined, e.g. mathematically, using an XOR operation, as the difference between each individual present check bit and the check bit with which it is to be updated. The difference may be used for the update process, i.e. the writing of the check bits to the memory device.

In various embodiments, during a writing process to an address a, in which data bits and corresponding check bits are to be written to the address a, the potentially erroneous data bits and check bits stored at present at the address a may be read.

In various embodiments, a difference between the data bits and check bits to be written and the data bits and the check bits corrected by applying the first code Cod1 may be used for determining a required modification of the check bits of the second code Cod2, and possibly of further codes.

In various embodiments, if the second check bits (of the second code Cod2) are determined using only the data bits, the required modification of the second check bits of the second code Cod2 may result from the difference of the corrected data bits corrected using the first code Cod1 and the data bits to be written. This may similarly apply to further codes.

FIG. 3A shows, in accordance with various embodiments, a schematic 301 of a circuit for correcting data bits read from a memory device and for a correct restoring of erroneous values in memory cells of the memory device.

In various embodiments, the circuit may include demultiplexers DMUX1 31, DMUX2 32, DMUX3 33 and DMUX6 314. Each of the demultiplexers may include a 0-input, a 1-input and an output corresponding to a word width. The circuit may further include a first coder Coder1 34 for the first code Cod1 34, a second coder Coder2 35 for the second code Cod2, an addressable memory device 36, a first corrector Korrektor1 37 for the first code Cod1, and a second corrector Korrektor2 38 for the second code Cod2.

At the 0-input of the demultiplexer DMUX2 32, k-dimensional data bits $d^i$ may be provided, and at the 1-input of the demultiplexer, the output of the demultiplexer MUX1 31 may be provided.

The output of the demultiplexer DMUX2 32 may be connected to the k-dimensional input of the first coder Coder1 34 and to the k-dimensional input of the second coder Coder2 35. The first coder Coder1 may be configured to form m check bits $c^i = c_1^i, \ldots, c_m^i$ and to provide, e.g. output them at its output, such that $d^i$, $c^i$ may be bits of a code word of the first code Cod1.

The output of the demultiplexer DMUX2 32 may be connected to the first k components of the k+m-dimensional 0-input of the demultiplexer DMUX3 33, and the m-bit-width output of the first coder Coder1, having the m check bits $c^i$, may be connected to at components of the 0-input of the demultiplexer DMUX3 33. The output of the second coder Coder2 35, having a width of k+m-bit here, may be connected to the 1-input of the demultiplexer DMUX3 33.

The k+m-bit-width output of the demultiplexer DMUX3 33 may be provided at the k+m-bit wide data input of the memory device 36 and may provide an address input to which a write address or a read address may be applied, and a first input for a write-signal w and an input for a read-signal r. If w=1 and r=0, the bits provided at the data input may be written to memory cells at the address provided at the address input, wherein the memory cells may be addressed by the provided address.

If w=0 and r=1, values that are presently stored in the memory cells that are addressed by the address provided at the address input may be provided at the data output of the memory device. The bits stored in the memory cells may, for example by having suffered from quantum effects or external influence, be erroneous, for example if the memory cells are MRAM cells.

The k+m-bit-width data output of the memory device 36, having the potentially erroneous bits $d^{i'}$, $c^{i'}$, may be connected to the k+m-bit wide input of the first corrector Korrektor1 37, and to the 1-input of the demultiplexer DMUX6 314.

In a case of an error, the bits $d^{i'}$, $c^{i'}$ read from the memory device may differ from the bits $d^{i'}$, $c^i$ written to the memory cells.

The first corrector Korrektor1 37 may be configured to provide, at its at least k-bit wide output, corrected values $d_{cor1}^i$ that have been corrected by applying the first code Cod1. The output of the first corrector Korrektor1 37 may be connected to the 0-input of the demultiplexer DMUX1 31 and to the 0-input of the demultiplexer DEMUX6 314. The demultiplexer DMUX6 314 may be followed by the second corrector Korrektor2. The k-bit-width output of the second corrector Korrektor2 may be connected to the 1-input of the demultiplexer DMUX1 31. In other words, the demultiplexer DMUX6 314 and the second corrector Korrektor2 38 may be sequentially arranged.

A method of operating the circuit if FIG. 3A in accordance with various embodiments will now be described.

The circuit may be operated in two modes of operation, a first operations mode and a second operations mode. Also, an inactive mode will be described.

In the first operations mode, data bits may be written to (also referred to as stored in) memory cells of the memory device 36 corresponding to addresses determined according to a specific task, wherein the writing may apply the first code Cod1 and first check bits corresponding to the data bits for a correction, and/or the corrected data bits may be read from said memory cells of the memory device, using for a correction the first code Cod1 and the first check bits corresponding to the data bits.

During a writing of the data bits $d^i$ at a write address $a_{j_i}$, the k data bits $d^i = d_1^i, \ldots, d_k^i$ may be provided at the 0-input of the demultiplexer DMUX2 32. The control signal st2 of the demultiplexer DMUX2 32 may be 0, such that the 0-input of the demultiplexer may be connected to its output, such that the data bits $d^i$ may be provided at the first coder Coder1 34 and k components of the 0-input of the demultiplexer DMUX3 53. The first coder Coder1 may provide at its output m check bits $c^i$, which may be provided to m further components of the 0-input of the demultiplexer DMUX3 33. The k+m bits $d^i$, $c^i$, provided at the 0-input of the demultiplexer DMUX3 53, may form a code word of the first code Cod1.

The control signal st3 of the demultiplexer DMUX3 33 may be 0, such that the code word $d^i$, $c^i$ may be passed on to the output of the demultiplexer DMUX3 33 and may be provided at the data input of the memory device 36, which may, at its address input, be provided with a write address $a_{j_i}$ (the write address may be task-specific). The code word $d^i$, $c^i$ may be written to respective memory cells of the memory device 36 at the address $a_{j_i}$. Here, it may be assumed that w=1 and r=0 are selected.

During a reading of potentially erroneous data bits $d^{i'}$ from the memory device, a read address $a_{j_i}$ may be provided at the address input of the memory device 36. r=1 and w=0 may be selected. In this example, $a_{j_i} = a_{j_i}$. One or more errors may cause $d^{i'}$ to differ from $d^i$. Likewise, one or more errors may cause $c^{i'}$ to differ from $c^i$.

At the data output of the memory device 36, $d^{i'}$, $c^{i'}$ may be provided. The control signal of the demultiplexer DMUX6 314 may be selected as st6=0. The data output of the memory device 36 may be connected to the k+m-bit wide input of the first corrector Korrektor1 37, which may be configured to provide at its k-bit wide output the corrected data bits $d_{cor1}^i$, which may have been corrected using the first code Cod1, if the one or more error(s) is/are correctable by the first code Cod1.

If the control signal st2 of the demultiplexer DMUX2 32 is 0, the corrected value $d_{cor}^1$ may not be written back to the memory device 36.

In various embodiments, the corrected value $d_{cor1}^i$ may be written to the memory device 36 at the address which is described below.

If the control signal st1 of the demultiplexer MUX1 31 is 0, this demultiplexer may connect its 0-input with its output, which may be connected to the 1-input of the demultiplexer DMUX2. The control signal st2 of the demultiplexer DMUX2 32 may be selected as 1. In that case, the 1-input of the demultiplexer DMUX2 32 may be connected with its output, such that $d_{cor1}^i$ may be provided at the input of the first coder Coder1 34 and at the k first components of the 0-input of the demultiplexer DMUX3 33. The first coder Coder1 54 may form the check bits $c_{cor1}^i$, such that $d_{cor1}^i$, $c_{cor1}^i$ may be provided at the k+m-bit wide 0-input of the demultiplexer DMUX3 53. The control signal st3 of the demultiplexer may be selected to be 0, such that $d_{cor1}^i$, $c_{cor1}^i$ may be provided at the data input of the memory device 36. If, at the address input, the address $a_{ji}$ is provided, and if w=1 and r=0, the potentially erroneous bits $d^{i}$, $c^{i}$ may be replaced by the corrected bits $d_{cor1}^i$, $c_{cor1}^i$, such that erroneous bits that may be corrected by applying the first code Cod1 may be overwritten by the correct bits, and a correct content of the memory device may be restored.

In various embodiments, the method may be varied.

In various embodiments, in the first operations mode, corrected bits may always be written back to the memory device if the errors are correctable by the first code Cod1.

In various embodiments, in the first operations mode, corrected bits may be not written back to the memory device.

In various embodiments, in the first operations mode, corrected bits may be written back if at least a σ-bit error has occurred, if the first code Cod1 is a t-bit-error correcting code, with 0<σ≤t and t≥2, and corrected bits may be not written back to the memory device, if no error or only a τ-bit error occurs, with τ<σ.

In various embodiments, corrected bits may be written back in the first operations mode if an address provided at the address input of the memory device 36 is an element of a set of addresses $\alpha_1=\{a_{11}, a_{12}, \ldots, a_{1,R}\}$. Herein, $\alpha_1$ may be a subset of addresses that may be known to have a higher probability of having errors in values stored in their assigned memory cells than other addresses with other memory cells that are not addressed by elements from $\alpha_1$.

The set $\alpha_1$ may be determined during start-up, for example using parameters like a write current required for a writing process, or a reading current required for a reading process.

In various embodiments, combinations of the described variations may be applied. In various embodiments, corrected data bits may be written back to the memory device if an error has occurred and the address is an element of the set $\alpha_1$, and the corrected data bits may always be written back to the applied address if a σ-bit-error has occurred, with σ being a predetermined value if the first code Cod1 is a t-bit correcting code with 0<σ≤t.

In various embodiments, in a second operations mode for addresses $a_1, \ldots, a_N$, which may include an addresses area or all addresses of the memory device, potentially erroneous data bits and check bits $d^{1t}, c^{1t} \ldots, d^{Nt}, c^{Nt}$ may be read from the memory device 36 at the addresses $a_1, \ldots, a_N$. The read data bits and check bits may be entered into the first corrector Korrektor1. The first corrector may, at its output, provide the corrected data bits $d_{cor1}^1, \ldots, d_{cor1}^N$. The output of the first corrector Korrrektor1 may be connected to the 0-input of the demultiplexer DMUX1 (see FIG. 3A). The control signal st1 of the demultiplexer may be selected as 0, such that the 0-input of the demultiplexer DMU X1 51 may be connected with its output. The output of the demultiplexer DMUX1 51 may be provided to the 1-input of the demultiplexer DMUX2 32. The control signal st2 of the demultiplexer may be set to 1, such that the 1-input of the demultiplexer may be connected with its output, which may at the same time be the input of the second coder Coder2 35 and may be connected to the input of the first Coder Coder1 34.

The first coder Coder1 34 may be configured to form, from the corrected data bits $d_{cor1}^i$ für i=1, …, N provided at its input, assigned check bits $c^{i*}$, which may be provided at its output, such that the bits $d_{cor1}^i$, $c^{i*}$ may form a code word of the first code Cod1.

The control signal st3 of the demultiplexer DMUX3 33 may be 0, as long as the bits $d_{cor1}^1, c^1, \ldots, d_{cor1}^N, c^N$ are provided by the first corrector Korrektor1 37 and are provided at the 0-input of the demultiplexer DMUX3 33.

The second coder Coder2 35 may be configured to form check bits $\gamma(d_{cor1}^1, \ldots, d_{cor1}^N)$ depending on data bits $d_{cor1}^1, \ldots, d_{cor1}^N$ provided at its input, such that the bits $d_{cor1}^1, \ldots, d_{cor1}^N, \gamma(d_{cor1}^1, \ldots, d_{cor1}^N)$ may form a code word of the second code Cod2.

After writing the bits $d_{cor1}^1, c^1, \ldots, d_{cor1}^N, c^N$ to the memory device 36 at the addresses $a_1, \ldots, a_N$, the control signal st3 of the demultiplexer DMUX3 33 may be set to 1, such that the check bits $\gamma(d_{cor1}^1, \ldots, d_{cor1}^N)$, which the second coder Coder2 35 may provide at its output, may be provided to the data input of the memory device 36. Depending on the word width $\gamma(d_{cor1}^1, \ldots, d_{cor1}^N)$ and the word width Wb of $d_{cor1}^i$, $c^{i*}$, the check bits $\gamma(d_{cor1}^1, \ldots, d_{cor1}^N)$ may be stored at M addresses $a_1^\gamma, \ldots, a_M^\gamma$ in the memory device 56 as words with a word width Wb, wherein M≥1.

If, for example, a word width of $d^i$ is 64 bit, and as the first code Cod1, a 2-bit-error correcting BCH-code with 14 check bits may be used, the word width $d_{cor1}^i$, $c^i$ is 78 bit.

If N=64, and the addresses area may consist of 64 addresses, the word width of $d_{cor1}^1, \ldots, d_{cor1}^{64}$ may be $2^{12}$ bits. If, for example, as the second code Cod2, a 4-bit-error correcting and 5-bit-error detecting BCH-code is used, a number of check bits of the second code Cod2 is 4·13+1=53<78, and the 53 check bits $\gamma(d_{cor1}^1, \ldots, d_{cor1}^{64})$ may be stored at an address $a_1^\gamma$ in the memory device 56 with a word width of 78, such that here M=1.

In a case of a 7-bit-error correcting BCH-code being used as the second code Cod2, the second code Cod2 may include 7·13=91 check bits, and the 91 check bits $\gamma(d_{cor1}^1, \ldots, d_{cor1}^{64})$ may be stored at two addresses $a_1^\gamma, a_2^\gamma$ in the memory device 36 with a word width of 78, such that here M=2.

In a case of a 1-byte-correcting second code Cod2 with a byte length of 64 bits being used, the second code Cod2 may include 128 check bits $\gamma(d_{cor1}^1, \ldots, d_{cor1}^{64})$, which may be stored at two addresses $a_1^\gamma, a_2^\gamma$ in the memory device 36 with a word width of 78, such that here M=2.

In various embodiments, for other codes, for example a Low-Density-Parity Code, a Reed Muller Code, or a Cross-Parity-code, the number M of addresses required for storing the check bits in the memory device 36 may be determined. The number of check bits for a linear code is equal to a number of linearly independent lines of a known parity check matrix) H of the second code Cod2.

In various embodiments, after the check bits $\gamma(d_{cor1}^1, \ldots, d_{cor1}^{64})$ have been stored at addresses $a_1^\gamma, \ldots, a_M^\gamma$ in the memory device, the circuit may be transferred to a mode, in which neither read access nor write access may be performed. This mode may be referred to as an inactive mode.

In a case of the memory cells being cells of an MRAM, it may happen that errors are introduced into the memory cells, for example due to quantum effects, while the memory device may be in the inactive mode. A number of errors generated in an inactive mode may depend on a temperature of the circuit, on a duration of the inactive mode, or on other, e.g. external, parameters.

If the circuit, which may have been in the inactive mode for a certain time duration, is supposed to be transferred to the first operations mode, potential errors in the memory cells may, in various embodiments, first be corrected in the second operations mode, and the corrected values may be written to the memory cells, such that correct values may be restored in the memory cells. After the restoration of the correct values in the memory cells, a transfer to the first operations mode may be performed.

A transfer of the circuit from the inactive mode to the first operations mode may be referred to as start-up. The second operations mode may be entered immediately after the inactive mode and before the circuit resumes operation, e.g. normal operation, in the first operations mode.

An example of the second operations mode will be given below.

In the second operations mode potentially erroneous data bits and check bits may be read from the memory device 36 at addresses of an addresses area. An address area $a_1, \ldots, a_N$ may serve as an example. From the memory device 36 the potentially erroneous data bits and the check bits $d^{1\prime}, c^{1\prime}, \ldots, d^{N\prime}, c^{N\prime}$ may be read, wherein the check bits $c^{1\prime}, \ldots, c^{N\prime}$ may be potentially erroneous check bits of the first code Cod1.

The first corrector Korrektor1 37 may correct the data bits $d^{1\prime}, \ldots, d^{N\prime}$ in $d_{cor1}^1, \ldots, d_{cor1}^N$ by applying the first code Cod1. As long as the first corrector Korrektor1 37 provides corrected data bits $d_{cor1}^1, \ldots, d_{cor1}^N$, the control signal st1 of the demultiplexer DMUX1 31 may be 0, the control signal st2 of the demultiplexer DMUX2 32 may be 1, and the control signal st3 of the demultiplexer DMUX3 33 may be 0. k first components of the 0-input of the demultiplexer DMUX3 33 and the input of the coder Coder1 may be provided with the corrected data bits $d_{cor1}^1, \ldots, d_{cor1}^N$). The first coder Coder1 may form the corresponding check bits $(c_{cor1}^1, \ldots, c_{cor1}^N)$, such that, for i=1, ..., N $(d_{cor1}^1, c_{cor1}^i)$ is a code word of the first code Cod1.

The output of the first coder Coder1 may be connected to further m, inputs of the 0-input of the demultiplexer DMUX3 33, such that the 0-input of the demultiplexer DMUX3 33 for i=1, ..., N may be provided with a code word $d_{cor1}^i, c_{cor1}^i$ that may also be provided to the data input of the memory devices 36. If w=1 and r=0, and if the address $a_i$ is provided at the address input of the memory device 36, $d^{i\prime}, c^{i\prime}$ may be overwritten by $d_{cor1}^i, c_{cor1}^i$.

If the bits $d^i, c^i$ have been corrupted during the inactive phase of the circuit to form the erroneous bits $d^{i\prime}, c^{i\prime}$, and if the error(s) is/are correctable by applying the first code Cod1, then $d_{cor1}^i, c_{cor1}^i = d^i, c^i$, and the correct contents of the memory device may be restored in the memory cells addressed by the address $a_i$.

If, during the inactive mode of the circuit, the bits $d^i, c^i$ have been changed into the erroneous bits $d^{i\prime}, c^{i\prime}$, and the error is not correctable using the first code Cod1, then $d_{cor1}^i, c_{cor1}^i \neq d^i, c^i$, and at the address $a_i$ erroneous bits $d_{cor1}^i, c_{cor1}^i$ may be stored, which do not correspond to the original bits $d^i, c^i$.

In various embodiments, N addresses $a_1, \ldots, a_N$ may be provided at the address input of the memory device 36. At the output of the memory device 36, the bits $d_{cor1}^1, c_{cor1}^1, \ldots, d_{cor1}^N, c_{cor1}^N$ may be provided, wherein the bits $d_{cor1}^1, \ldots, d_{cor1}^N$ may be provided at the 1-input of the demultiplexer DMU X6 314. If the value of the control signal st6 is 1, the bits $d_{cor1}^1, \ldots, d_{cor1}^N$ may be provided at the input of the corrector Korrektor2 38.

If the addresses $a_1^\gamma, \ldots, a_M^\gamma$ are now provided at the address input of the memory device 36, the bits $\gamma'(d^1, \ldots, d^N)$ may be provided at the data output of the memory device 36 and, via the demultiplexer DEMUX6 314, a control signal of which may be st6=1, may be passed on to the input of the second corrector Korrektor2 38. The second corrector Korrektor2 38 may be configured to provide at its output the corrected Bits $d_{cor2}^1, \ldots, d_{cor2}^N, \gamma(d^1, \ldots, d^N)_{cor2}$ that may have been corrected by applying the first code Cod2, wherein $d_{cor2}^1, \ldots, d_{cor2}^N, \gamma(d^1, \ldots, d^N)_{cor2}$ may be a code word of the second Cod2 if the error is correctable by the second code Cod2.

The control signal st1 of the demultiplexer DMUX1 31 may be 1, the control signal st2 of the demultiplexer DMUX2 32 may be 1, and the control signal st3 of the demultiplexer DMUX3 33 may be 0, such that the corrected data bits $d_{cor2}^1, \ldots, d_{cor2}^N$, which may have been corrected by the corrector Korrektot2 38 by applying the second code Cod2, and the check bits $c^1 (d_{cor2}^1), \ldots, c^N1 (d_{cor2}^N)$ determined by the first coder Coder1 from the corrected data bits $d_{cor2}^1, \ldots, d_{cor2}^N$, may be provided at the data input of the memory device 36 and may be stored at addresses $a_1, \ldots, a_N$.

If an error corrupting the bits $d^i, c^i$ in $d^{i\prime}, c^{i\prime}$ is correctable by applying the second code Cod2, then $d^i, c^i = d_{cor2}^i, c^i(d_{cor2}^i)$, and the contents of the memory cells that may be addressed by the address $a_i$ may have been restored.

In various embodiments, data read from the memory device 36 may be corrected directly by the second corrector Korrektor2 38 if the control signal st6 of the demultiplexer DMUX6 314 is 1.

In various embodiments, data read from the memory device 36 may be corrected directly by the first corrector Korrektor1 37, and may subsequently be corrected by the second corrector Korrektor2 38, if the control signal st6 of the demultiplexer DMUX6 314 is 0.

In various embodiments, data may first be read from the memory device 36 and may be corrected using the second corrector Korrektor2, and the corrected data may be written back to the memory device 36. Subsequently, the data corrected by the second corrector Korrektor2 may be read from the memory device 36, may be corrected using the first corrector Korrektor1, and may be written back to the memory device 36.

FIG. 3B shows, in accordance with various embodiments, a partial view of a schematic of a circuit for correcting data bits read from a memory device and for a correct restoring of erroneous values in memory cells of the memory device, wherein the circuit may include an error detection circuit.

The partial view of the schematic of the circuit of FIG. 3B may be a partial view of a modified circuit as shown in FIG. 3A, wherein similar partial circuits in FIGS. 3A and 3B may have been provided with identical references.

A difference between FIG. 3B and FIG. 3A may now be explained. In FIG. 3A, the data output of the memory device 36 may be connected with the input of the corrector Korrektor1 37 and with the 1-output of the demultiplexer DMUX6 314, whereas in FIG. 3B, the data output of the memory device 36 may be connected to the input of the first corrector Korrektor1 37, with the 1-input of the demultiplexer DMUX6 314, and with the input of an error detector 39. The output of the error detector 39, which may have a 1-bit-width error signal E, may be provided at a first input of an AND-gate 310. At the second input of the AND-gate 310, a signal w' may be provided, and its output may provide a write-enable signal w. If the binary error signal E has the value 0, the write-enable signal w may be 0, irrespective of a value of the binary signal w'.

If the error detector 39 provides the value E=0 at its output, the data value provided at the data input of the memory device 36 will not be written to the memory device 36 at the provided address.

In various embodiments, the error detector may be configured to provide an error signal E=0, if the memory device 36 provides a code word $d^i$, $c^i$ of the code Cod1 at a data output that may be provided at its input. For a code word of the first code Cod1, no correction may be required, and thus it may be possible to write data back to the memory device only in a case of a correction being performed by the first corrector Korrektor1 37.

In various embodiments, the error detector may be configured to provide an error signal E=0, if the memory device 36 provides an erroneous word with an error that may maximally be a σ-bit-error, if the first code Cod1 is a t-bit-error correcting code with t≥2 and 1≤σ≤t.

If for example t=3 and σ=2, the data bits corrected by the first corrector Korrektor1 may only be written back to the memory device 36 if at least a 2-bit error was corrected in the data.

In a case of no correction having been applied, or of only having corrected a 1-bit-error, the erroneous data bits in the memory device 36 may not be overwritten. Since 2-bit and 3-bit errors may occur much less frequently than 1-bit-errors, an overwriting of the data may also occur relatively rarely, which may reduce a power consumption.

1-bit-errors present in the memory device that have not been restored may be securely corrected by a 3-bit error correcting code even in a case of one or two additional errors accumulating before the next reading of the data.

Figure 3C:
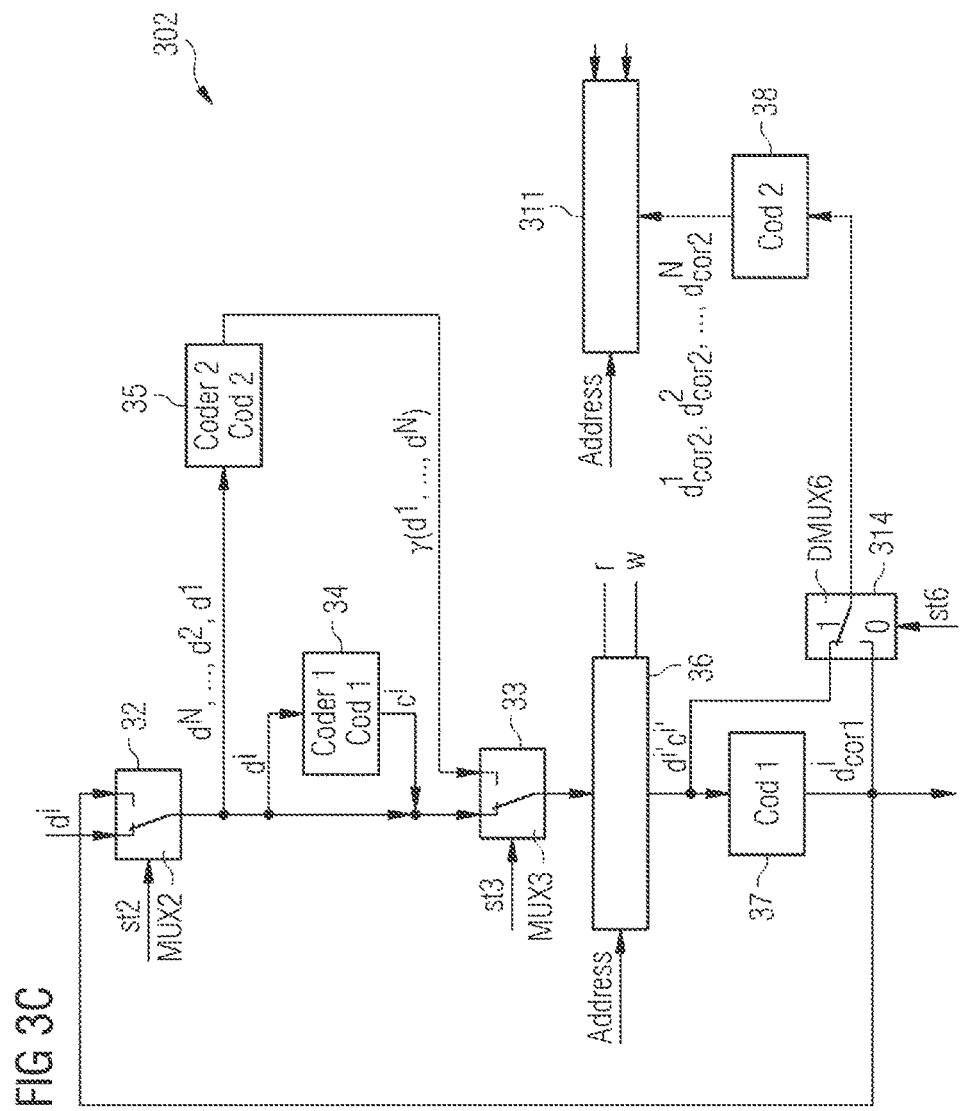
FIG. 3C shows, in accordance with various embodiments, a schematic of a circuit for correcting data bits read from a memory device and for a correct restoring of erroneous values in memory cells of a second memory device.

FIG. 3C shows, in accordance with various embodiments, a schematic 302 of a circuit for correcting data bits read from a memory device and for a correct restoring of erroneous values in memory cells of a second memory device.

In various embodiments, the data corrected by the first corrector Korrektor1 may be written to a further memory device 311 that may be different from the memory device 36. The circuit shown in FIG. 3C may differ from the circuit of FIG. 3A by writing the data, which have been corrected by the second corrector Korrektor2, to the memory device 311, which may be different from the memory device 36 from which the data to be corrected are read. For similar or identical parts in FIG. 3A and FIG. 3C, identical references are used.

In various embodiments, the further memory device 311 may include a register or a register array.

In various embodiments, data corrected by the first corrector Korrektor1, for example $d_{cor1}^i$, $c_{cor1}^i$, may be written to an address $a_i'$ in a memory device that may be different from the address $a_i$ at which the potentially erroneous data $d^{i'}$, $c^{i'}$ may have been read from the memory device. The memory device to which the data may be written may be the same as the memory device from which the data were read. In a case of the memory device, from which the data were read, being organized in blocks, the data read from one block of the memory device may, in various embodiments, be corrected and be written to a different block of the memory device.

In various embodiments, data corrected by the second corrector Korrektor2, for example $d_{cor2}^i$, $c_{cor2}^i$, may be written to an address $a_i^*$ in a memory device that may be different from the address $a_i$ at which the potentially erroneous data $d^{i'}$, $c^{i'}$ may have been read from the memory device.

Figure 3D:
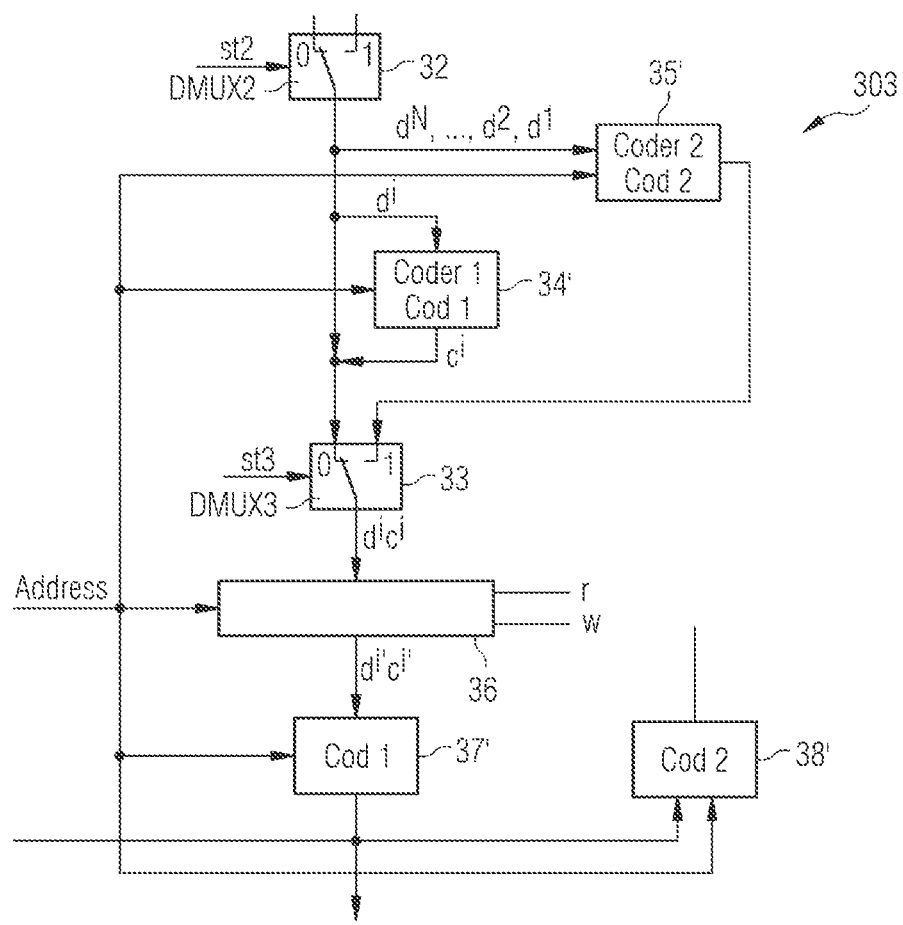
FIG. 3D shows, in accordance with various embodiments, a schematic of a circuit for correcting data bits read from a memory device and for a correct restoring of erroneous values in memory cells, wherein a corrector of the first code and of the second code and the coder of the first code and of the second code may depend on address bits of the address used for the writing and/or for the reading.

FIG. 3D shows, in accordance with various embodiments, a schematic 303 of a circuit for correcting data bits read from a memory device and for a correct restoring of erroneous values in memory cells, wherein a corrector of the first code and of the second code and the coder of the first code and of the second code may depend on address bits of the address used for the writing and/or for the reading.

FIG. 3D shows a partial circuit of a modified circuit of FIG. 3A. For similar or identical parts in FIG. 3A and FIG. 3D, identical references are used. This may refer to the parts 32, 33, and 36. The first coder Coder1 34 of FIG. 3A may be replaced by a modified first coder Coder1 34' of FIG. 3D. The second coder Coder2 35 of FIG. 3A may be replaced by a modified second coder Coder2 35' of FIG. 3D. The first corrector Korrektor1 37 of FIG. 3A may be replaced by a modified first corrector Korrektor1 37' of FIG. 3D. The second corrector Korrektor2 38 of FIG. 3A may be replaced by a modified second corrector Korrektor2 38' of FIG. 3D.

The first coder Coder1 34' may include a k-bit-width input, to which k-bit-width data bits $d^i$ may be provided, and it may include a second l-bit-width input, to which the l bits of a write address $a_i^s$ of the memory device 36 may be provided. The first coder Coder1 4' may be configured to provide at its m-bit-width output check bits $c^i$, such that $d^i$, $a_i^s$, $c^i$ may be a code word of the first code Cod1. The bits $d^i$, $c^i$ may be bits of a code word of the first code Cod1.

The second coder Coder2 34' may include a k-bit-width input, to which k-bit-width data bits $d^i$ may be provided, and it may include a second l-bit-width input, to which the l bits of a write address $a_i^s$ of the memory device 36 may be provided.

The second coder Coder2 35' may be configured to provide at its output check bits $\gamma(d^1, a_1^s, \ldots, d^N, a_N^s)$, such that $d^1, \ldots, d^N, a_1^s, \ldots, a_N^s, \gamma(d^1, a_1^s, \ldots, s^N, a_i^N)$ may be a code word of the second code Cod2.

In various embodiments, the data bits, bits derived from address bits, and check bits may, in an error-free case, be a code word of a respective code, e.g. of the first code, of the second code, or of a potential further code.

Figure 4:
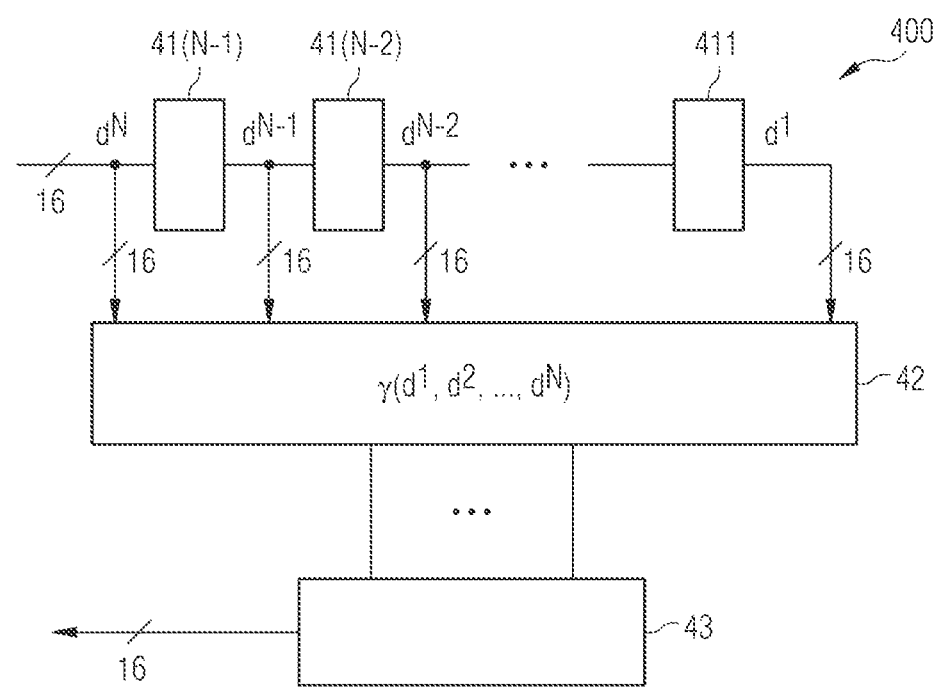
FIG. 4 shows, in accordance with various embodiments, a schematic of a circuit for realizing a code including a serial-parallel-conversion, wherein the circuit may be used for forming check bits of a second code.

FIG. 4 shows, in accordance with various embodiments, a schematic 400 of a circuit for realizing a code including a serial-parallel-conversion, wherein the circuit may be used for forming check bits of a second code.

FIG. 4 shows an exemplary embodiment of a second coder Coder2. It may be assumed that the data bits may be 16 bits wide. The data bits $d^1, \ldots, d^N$ with a width of 16 bits each may be entered into a serial circuit of N−1 registers 411, ..., 61(N−1), each with a word width of 16. The 16 bit wide input of the register 41(N−1) and the N−1 outputs of the registers 41 (N−2), ..., 411, each with a width of 16 bits, may be routed to a combinatorial circuit 42 for determining the check bits $\gamma(d^1, \ldots, d^N)$. The output may be routed to a parallel-serial-converter 43, if the word with of $\gamma(d^1, \ldots, d^N)$ is larger than 16. At the 16 bit wide output of the parallel-serial-converter, the words $\gamma(d^1, \ldots, d^N)$ may be output as partial words of a width of 16.

In various embodiments, a sequential coding may be applied, as for example used in cyclical codes by applying a feedback shift register, which a person skilled in the art may be familiar with.

Figure 5:
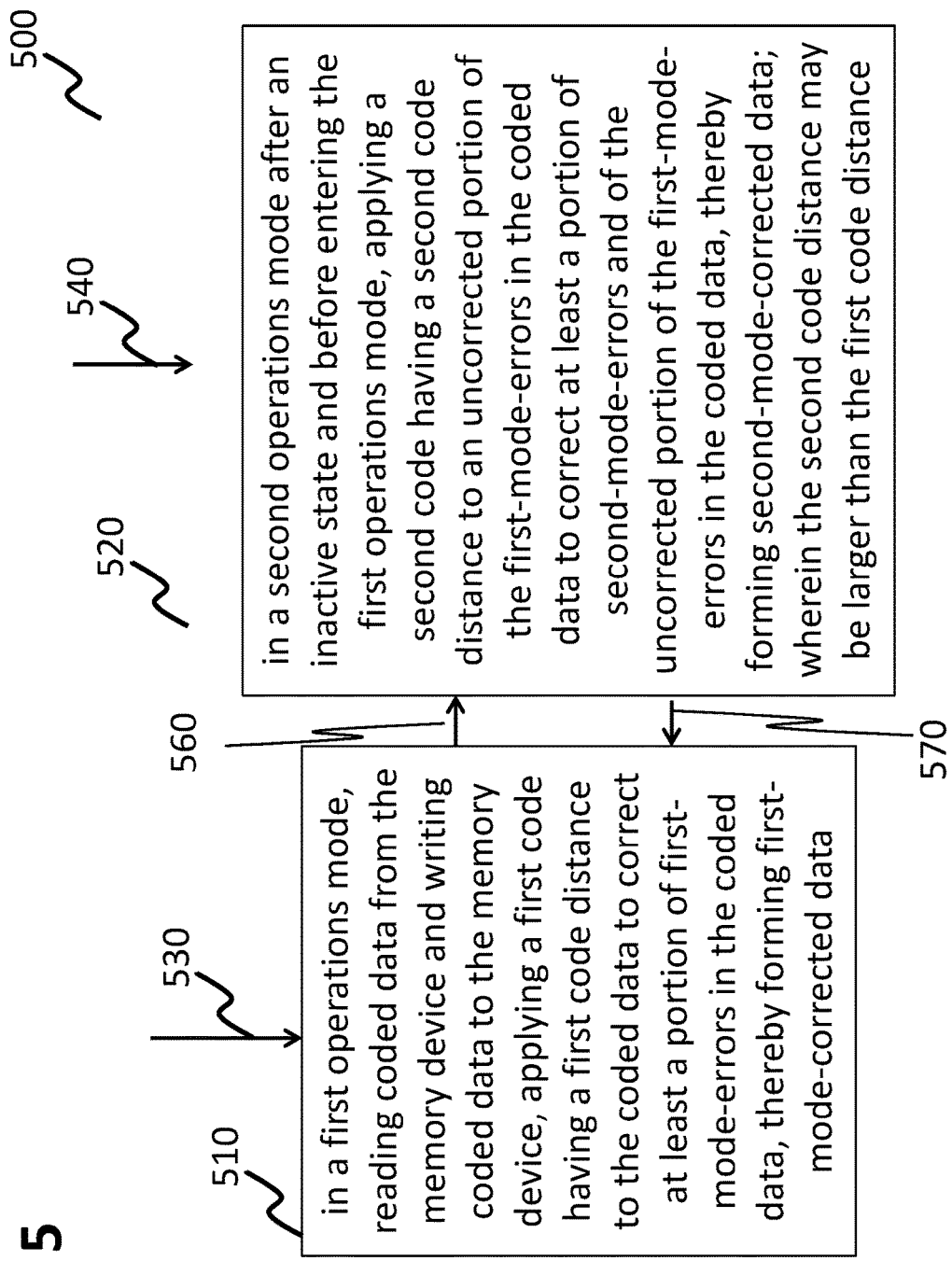
FIG. 5 shows a process flow of a method of operating a memory device in accordance with various embodiments.

FIG. 5 shows a process flow 500 of a method of operating a memory device in accordance with various embodiments.

In various embodiments, the method may include, in a first operations mode, reading coded data from the memory device and writing coded data to the memory device, applying a first code having a first code distance to the coded data to correct at least a portion of first-mode-errors in the coded data, thereby forming first-mode-corrected data (in 510).

In various embodiments, the method may include, in a second operations mode after an inactive state and before entering the first operations mode, applying a second code having a second code distance to an uncorrected portion of the first-mode-errors in the coded data to correct at least a portion of second-mode-errors and of the uncorrected portion of the first-mode-errors in the coded data, thereby forming second-mode-corrected data, wherein the second code distance may be larger than the first code distance (in 520).

In various embodiments, the first operations mode may be entered from the second operations mode, as indicated by an arrow 570. In other words, the second operations mode may be executed before transferring the memory device to the first operations mode. This may for example be the case at a start-up of the memory device, or after having previously transferred the memory device from the first operations mode to the second operations mode.

In various embodiments, the first operations mode may be entered without passing through the second operations mode, as indicated by an arrow 530. Such a direct route to the first operations mode may for example be executed in a case of the memory device having been in a state that may be different from the first operations mode and different from the second operations mode, and in which it may not be likely that a large number of errors may accumulate, for example because the memory device had only been in the state for a short duration, for example a short idle phase that has followed a first operations mode or a second operations mode.

In various embodiments, the second operations mode may be entered directly, as indicated by an arrow 540. Such a situation may for example occur at a start-up of the memory device. In that case, errors which may have accumulated during an inactive phase may be corrected, e.g. correct values may be restored in the memory device, before entering the first operations mode, which may be a normal operations mode.

The second operations mode may also be entered from the first operations mode, as indicated by an arrow 560. This situation may for example occur before a shut-down of the memory device, e.g. before transferring the memory device to an inactive state.

Figure 6:
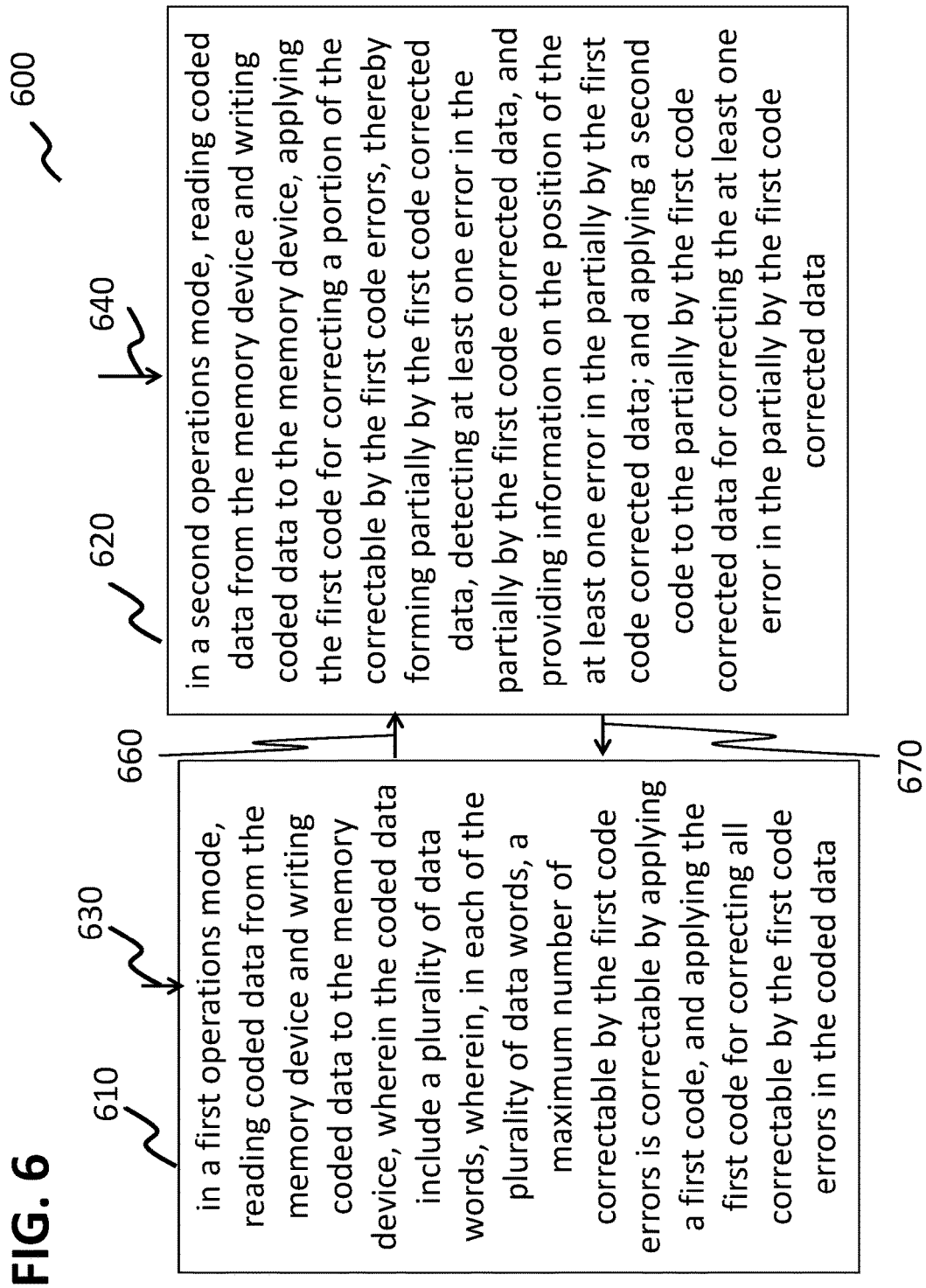
FIG. 6 shows a process flow of a method of operating a memory device in accordance with various embodiments.

FIG. 6 shows a process flow 600 of a method of operating a memory device in accordance with various embodiments.

In various embodiments, the method may include, in a in a first operations mode, reading coded data from the memory device and writing coded data to the memory device, wherein the coded data may include a plurality of data words, wherein, in each of the plurality of data words, a maximum number of correctable by the first code errors may be corrected by applying a first code, and applying the first code for correcting all correctable by the first code errors in the coded data (in 610).

In various embodiments, the method may include, in a second operations mode, reading coded data from the memory device and writing coded data to the memory device, applying the first code for correcting a portion of the correctable by the first code errors, thereby forming partially by the first code corrected data, detecting at least one error in the partially by the first code corrected data; and applying a second code to the partially by the first code corrected data for correcting the at least one error in the partially by the first code corrected data (in 620).

In various embodiments, in the second operations mode, the coded data may include a plurality of data words, wherein, in each of the plurality of data words, a maximum number of correctable-first-mode-errors may be correctable by applying the first code.

In various embodiments, the first operations mode may be entered from the second operations mode, as indicated by an arrow 670. In other words, the second operations mode may be executed before transferring the memory device to the first operations mode.

In various embodiments, the first operations mode may be entered without passing through the second operations mode, as indicated by an arrow 630.

In various embodiments, the second mode may be entered directly, as indicated by an arrow 640.

The second operations mode may also be entered from the first operations mode, as indicated by an arrow 660.

Figure 7:
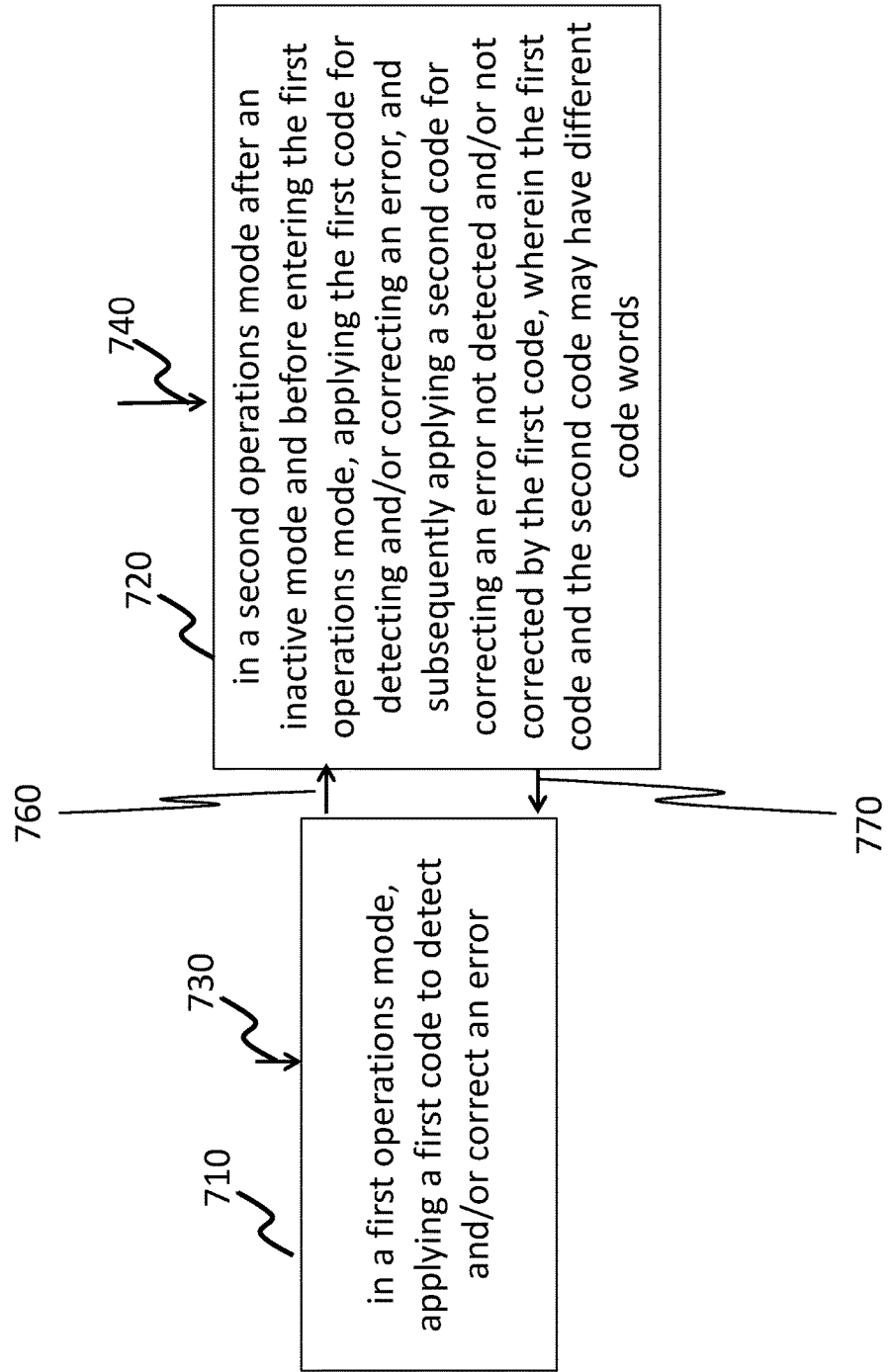
FIG. 7 shows a process flow of a method of operating a memory device in accordance with various embodiments.

FIG. 7 shows a process flow 700 of a method of operating a memory device in accordance with various embodiments.

In various embodiments, the method may include, in a in a first operations mode, applying a first code to detect and/or correct an error (in 710). In various embodiments, at least one error, e.g. a plurality of errors, may be detected and/or corrected in the first operations mode.

In various embodiments, the method may include, in a second operations mode, after an inactive mode and before entering the first operations mode, applying the first code for detecting and/or correcting an error, and subsequently applying a second code for correcting an error not detected and/or not corrected by the first code, wherein the first code and the second code may have different code words (in 720). In various embodiments, at least one error, e.g. a plurality of errors, may be detected and/or corrected in the second operations mode.

In various embodiments, the first operations mode may be entered from the second operations mode, as indicated by an arrow 770. In other words, the second operations mode may be executed before transferring the memory device to the first operations mode.

In various embodiments, the first operations mode may be entered without passing through the second operations mode, as indicated by an arrow 730.

In various embodiments, the second mode may be entered directly, as indicated by an arrow 740.

The second operations mode may also be entered from the first operations mode, as indicated by an arrow 760.

Figure 8:
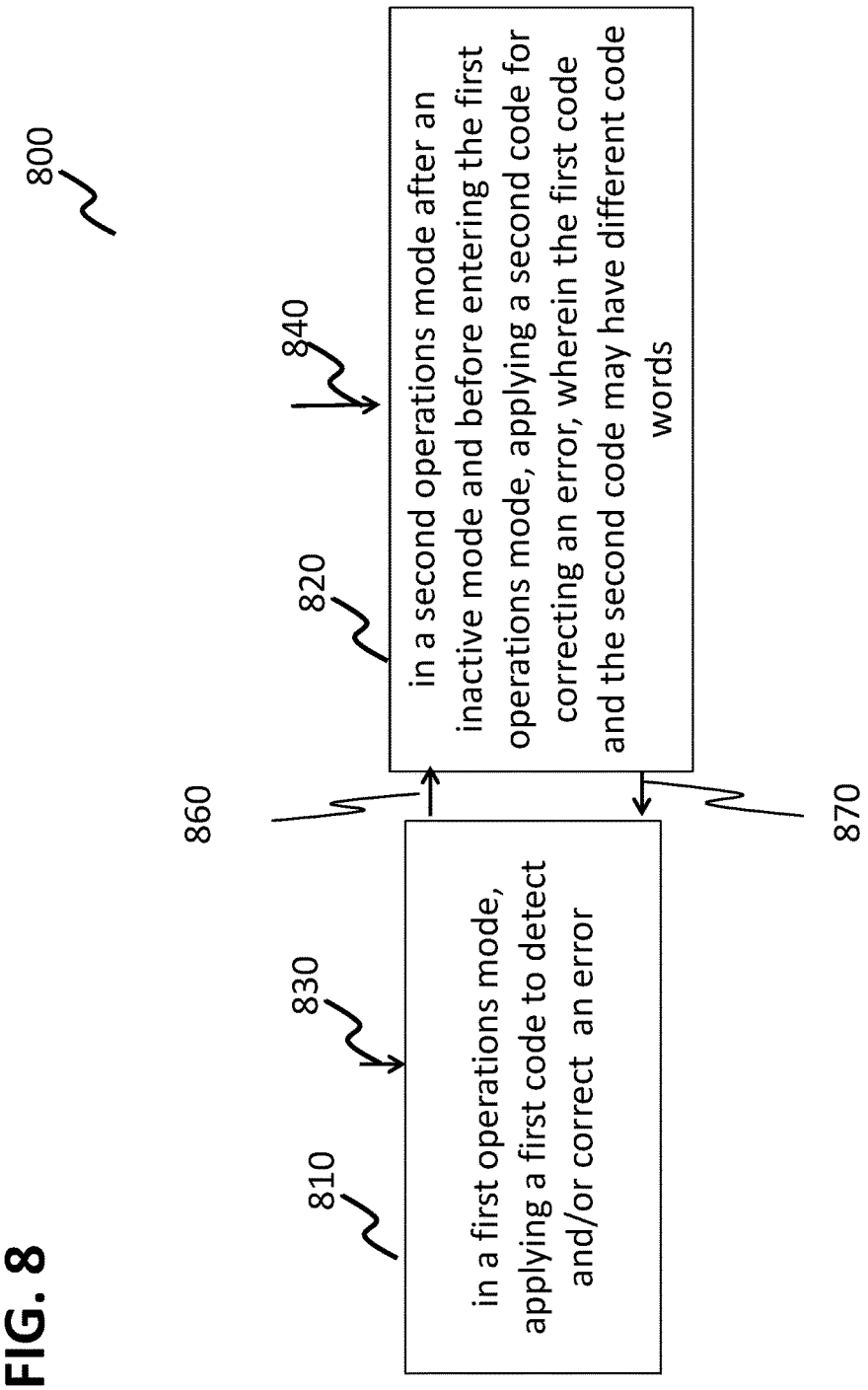
FIG. 8 shows a process flow of a method of operating a memory device in accordance with various embodiments.

FIG. 8 shows a process flow 800 of a method of operating a memory device in accordance with various embodiments.

In various embodiments, the method may include, in a in a first operations mode, applying a first code to detect and/or correct an error (in 810). In various embodiments, at least one error, e.g. a plurality of errors, may be detected and/or corrected in the first operations mode.

In various embodiments, the method may include, in a second operations mode, after an inactive mode and before entering the first operations mode, applying a second code for correcting an error, wherein the first code and the second code may have different code words (in 820). In various embodiments, at least one error, e.g. a plurality of errors, may be detected and/or corrected in the second operations mode.

In various embodiments, the first operations mode may be entered from the second operations mode, as indicated by an arrow 870. In other words, the second operations mode may be executed before transferring the memory device to the first operations mode.

In various embodiments, the first operations mode may be entered without passing through the second operations mode, as indicated by an arrow 830.

In various embodiments, the second mode may be entered directly, as indicated by an arrow 840.

The second operations mode may also be entered from the first operations mode, as indicated by an arrow 860.

In various embodiments, a method of correcting and/or detecting an error in a memory device is provided. The method may include: in a first operations mode, applying a first code to detect and/or correct an error, and in a second operations mode after an inactive mode and before entering the first operations mode, applying a second code for correcting and/or detecting an error, wherein the first code and the second code have different code words.

In various embodiments, in the second mode of operations, in addition to the second code, at least another error detecting and/or correcting code may be applied.

In various embodiments, in the second mode of operations, in addition to the second code, the first code may be applied.

In various embodiments, in the second mode of operations, the first code may be applied before the second code is applied.

In various embodiments, a method of correcting an error in a memory device is provided. The method may include, in a first operations mode, applying a first code to detect and/or correct an error, and, in a second operations mode after an inactive mode and before entering the first operations mode, applying the first code for detecting and/or correcting an error, and subsequently applying a second code for correcting an error not corrected by the first code; wherein the first code and the second code may have different code words.

In various embodiments, one error or at least one error, e.g. a plurality of errors, may be detected and/or corrected in the first operations mode and/or in the second operations mode.

In various embodiments, the first operations mode, the second operations mode and the inactive mode may be used in a sequence of (in other words, in an order of) first operations mode, inactive mode, second operations mode, and first operations mode.

In various embodiments, in the second operations mode, the second code may be applied for correcting at least a portion of errors not corrected by applying the first code in the first operations mode.

In various embodiments, the memory device may be a component of a vehicle, wherein the inactive mode may include a key-off mode, the memory device may be operated in the second operations mode during a boot phase of a key-on mode, and the memory device may be operated in the first operations mode in the key-on mode after the boot phase.

In various embodiments, the memory device may be in the inactive mode when the vehicle is idle, and when no operating power is provided to the memory device.

In various embodiments, the memory device may be used in the second operations mode during a starting of the vehicle.

In various embodiments, in the second operations mode, the applying the second code for correcting errors may include applying a combination of the first code and the second code.

In various embodiments, the applying the combination of the first code and the second code may include applying the first code for error correction.

In various embodiments, a plurality of data units and at least one corresponding check unit may be stored in the memory device under an address comprising a plurality of address units, and wherein, in an error-free case, the data units, the at least one check unit, and the address units may form a code word of the first code.

In various embodiments, a plurality of data units and at least one corresponding check unit may be stored in the memory device under an address comprising a plurality of address units, and wherein, in an error-free case, the data units, the at least one check unit, and an address information unit derived from the plurality of address units may form a code word of the first code.

In various embodiments, a plurality of data units may be stored in the memory device, and in the first operations mode and/or in the second operations mode, the applying the first code may include correcting the plurality of data units in parallel using the first code.

In various embodiments, a plurality of data units may be stored in the memory device, and in the second operations mode, the applying the second code may include correcting the plurality of data units sequentially using the second code.

In various embodiments, coded data may be stored in the memory device, the coded data may include a plurality of coded data units including a plurality of data words, each data word comprising a plurality of data information units and at least one first check unit, coded data corrected in the first operations mode are first-mode-corrected data, and data corrected in the second operations mode may be second-mode-corrected data, the first-mode-corrected data may include a plurality of first-mode-corrected data units including a plurality of data words, each data word including a plurality of data information units and at least one first check unit, and the second-mode-corrected data may include a plurality of second-mode-corrected data units including a plurality of data words, each data word including a plurality of data information units and at least one second check unit.

In various embodiments, the method may further include, in the first operations mode, if the first code is used for correcting errors, thereby forming first-mode-corrected data, writing at least a portion of the first-mode-corrected data to the memory device.

In various embodiments, in the first operations mode, data stored in the memory device may also be refreshed or restored. The restoring may be applied to digital data values, and the refreshing may be applied to continuous or multi-valued data values.

In various embodiments, the method may further include: in the first operations mode, if the first code is used for correcting errors, thereby forming first-mode-corrected data, forming at least one second check unit using the first-mode-corrected data.

In various embodiments, the at least one second check unit may be formed before entering the inactive mode.

In various embodiments, the method may further include assigning an individual address to a coded data unit of the plurality of coded data units, wherein a first-mode-corrected data unit of the plurality of first-mode-corrected data units is written to the address from which the coded data unit was read.

In various embodiments, in the first-mode-corrected data, the plurality of data information units may include at least one corrected data information unit, and the at least one first check unit may include at least one corrected first check unit.

In various embodiments, in the second operations mode, the at least one first check unit may be additionally used for correcting the data.

In various embodiments, in the second operations mode, the at least one first check unit may be used for defining error positions in the coded data and/or in the first-mode-corrected data.

In various embodiments, the method may further include sending an inactive-start-signal for entering the inactive mode, and/or sending an inactive-end-signal for ending the inactive mode.

In various embodiments, the first-mode-corrected data and/or the second-mode-corrected data may be written to addresses that are different from the addresses assigned to the coded data.

In various embodiments, the method may further include, in the first operations mode, if the first code is used for correcting errors, thereby forming first-mode-corrected data, writing the first-mode-corrected data to a second memory device, and/or in the second operations mode, by the applying of the second code, forming second-mode-corrected data, and writing the second-mode-corrected data to the second memory device.

In various embodiments, the method may further include, in the first operations mode, before writing a new coded data unit to a target address of the individual addresses, comparing an old coded data unit stored at the target address with the new coded data unit, writing the new coded data unit to the target address, and forming the at least one second check unit if the new coded data unit is different from the old coded data unit.

In various embodiments, the inactive-end-signal may be sent before entering the second operations mode.

In various embodiments, the method may further include forming the at least one secondary check bit, and writing the second-mode-corrected data and the at least one secondary check bit to the memory device, and the inactive-start-signal may be sent after the storing of the second-mode-corrected data and the at least one secondary check bit to the memory device.

In various embodiments, a code distance of the second code may be larger than a code distance of the first code.

In various embodiments, the first code may be a t-bit-error correcting code, and $\sigma$ may be a constant with $0<\sigma\leq t$ with $t\geq 2$, and the method may further include: if a $\mu$-bit-error was corrected during the first operations mode, thereby forming first-mode-corrected data, and $\sigma\leq\mu\leq t$, writing the first-mode-corrected data to the memory device, and not writing the first-mode-corrected data to the memory device if $\mu<\sigma$.

In various embodiments, a method of operating a memory device is provided. The method may include: in a first operations mode, reading coded data from the memory device and writing coded data to the memory device, applying a first code to the coded data to correct at least a portion of errors in the coded data, thereby forming first-mode-corrected data, and in a second operations mode after an inactive state and before entering the first operations mode, applying a second code to correct at least a portion of errors wherein the first code and the second code may have different code words. Thereby it may be possible that the code distance of the first code is smaller than the code distance of the second code. In various embodiments, the method may include, in a second operations mode, reading coded data from the memory device and writing coded data to the memory device, applying the first code for correcting a portion of the correctable by the first code errors thereby forming partially by the first code corrected data, detecting at least one error in the partially by the first code corrected data; and applying a second code to the partially by the first code corrected data for correcting the at least one error in the partially by the first code corrected data (in 620).

In various embodiments, a method of correcting and detecting errors in a memory device is provided, wherein in a mode of operation an error correcting and/or error detecting code C with a code distance allowing to correct up to t-bit errors is applied, wherein an error with up to $\tau$ erroneous bits may be corrected into a codeword of the code C, and an error with more than $\tau$ erroneous bits may not be correctly corrected and may be detected as a non-code word of the code C, whereby $0<T\leq t$ and $t\geq 2$.

In various embodiments, after the applying the error correcting and/or error detecting code C (with a code distance allowing to correct up to t-bit errors) in the mode of operation, a further code may be applied to correct an error.

In various embodiments, a detected error may be corrected by the further code as an erasure.

In various embodiments, the method may further include, in the first operations mode, writing the first-mode-corrected data to the memory device.

In various embodiments, the coded data may include a plurality of coded data units including a plurality of data words, each data word including a plurality of data information units and at least one first check unit, the first-mode-corrected data may include a plurality of in the first mode corrected data units including a plurality of data words, each data word including a plurality of data information units and at least one first check unit, and the second-mode-corrected data may include a plurality of in the second mode corrected data units including a plurality of data words, each data word including a plurality of data information units and at least one second check unit.

In various embodiments, the method may further include forming at least one second check unit using the first-mode-corrected data.

In various embodiments, the at least one second check unit may be formed before entering the inactive state.

In various embodiments, the at least one second check unit may be formed before entering the second operations mode.

In various embodiments, the method may further include assigning an individual address to each of the coded data units, wherein each of first-mode-corrected data units may be written to the address of the corresponding coded data unit.

In various embodiments, a plurality of individual addresses may be addresses of a contiguous address area.

In various embodiments, a plurality of individual addresses may be all addresses of the memory device.

In various embodiments, in the first-mode-corrected data, the plurality of data information units may include at least one corrected data information unit, and the at least one first check unit may include at least one corrected first check unit.

In various embodiments, in the second operations mode, the at least one first check unit may be additionally used for correcting the data.

In various embodiments, in the second operations mode, the at least one first check unit may be used for defining error positions in the coded data. The coded data may be erroneous.

In various embodiments, in the second operations mode, the at least one first check unit may be used for defining error positions in the first-mode-corrected data.

In various embodiments, in the inactive state, no coded data may be read from the memory device and no coded data may be written to the memory device.

In various embodiments, the method may further include sending an inactive-state-start-signal for entering the inactive state, and/or sending an inactive-state-end-signal for ending the inactive state.

In various embodiments, the first-mode-corrected data and/or the second-mode-corrected data may be written to addresses that may be different from the addresses assigned to the coded data.

In various embodiments, the first-mode-corrected data and/or the second-mode-corrected data may be written to a second memory device.

In various embodiments, the method may further include, in the first operations mode, before writing a new coded data unit to a target address of the individual addresses, comparing an old coded data unit stored at the target address with the new coded data unit, writing the new coded data unit to the target address, and forming the at least one second check unit if the new coded data unit is different from the old coded data unit.

In various embodiments, the inactive-state-end-signal may be sent before entering the second operations mode, and the method may further include forming the at least one secondary check bit, and writing the second-mode-corrected data and the at least one secondary check bit to the memory device, and wherein the inactive-state-start-signal may be sent after the storing of the second-mode-corrected data and the at least one secondary check bit to the memory device.

In various embodiments, the first code may be a t-bit-error correcting code, and $\sigma$ may be a constant with $0 < \sigma \le t$ with $t \ge 2$, and the method may further include writing the first-mode-corrected data to the memory device if a $\mu$-bit-error was corrected during the first operations mode, and $\sigma \le \mu \le t$, and not writing the first-mode-corrected data to the memory device if $\mu < \sigma$.

In various embodiments, the inactive state may be a state preceding a start-up of a device using the memory device.

In various embodiments, the method may further include, after having read coded data in the first operations mode from $T_1$ addresses of the memory device, or after having written coded data to $T_2$ addresses of the memory device, forming second check units using the stored data units, and storing the second check units in the memory device.

In various embodiments, $T_1 + T_2 > 1$.

In various embodiments, the method may further include, in a third operations mode after a second operations mode, applying a third code having a third code distance to the second-mode-corrected data to correct uncorrected errors in the second-mode-corrected data, thereby forming third-mode-corrected data.

In various embodiments, the third mode corrected data may be written to the memory device.

In various embodiments, third check units of the third code may be written to the memory device.

In various embodiments, the third check units may be formed using the first check units and the second check units.

In various embodiments, the first code may be a block code, including a Hamming code, a shortened Hamming code, a Hsiao code, a shortened Hsiao code, a t-bit-error correcting BCH code, a shortened t-bit-error correcting BCH code, for example with $t \ge 2$, a Reed-Muller-Code, a shortened Reed-Muller-Code, a cyclic code, a shortened cyclic code, low-density parity code, or a byte-correcting code.

In various embodiments, the second code may be a block code, including a parity code, a Hamming code, a shortened Hamming code, a Hsiao code, a shortened Hsiao code, a t-bit-error correcting BCH code, a shortened t-bit-error correcting BCH code, for example with $t \ge 2$, a Reed-Muller-Code, a shortened Reed-Muller-Code, a cyclic code, a shortened cyclic code, a Reed-Solomon-Code, a shortened Reed-Solomon-Code, a modified Reed-Solomon-Code, a byte-correcting code, low-density parity code, a non-linear code or a RAID-code.

In various embodiments, a method of using a memory device may be provided. The method may include, in a first operations mode, reading coded data from the memory device and writing coded data to the memory device, wherein the coded data may include a plurality of data words, wherein, in each of the plurality of data words, a maximum number of errors may be correctable by applying a first code, and applying the first code for correcting all correctable by the first code errors, and, in a second operations mode, reading coded data from the memory device and writing coded data to the memory device, wherein the coded data may include a plurality of data words, wherein, in each of the plurality of data words, a maximum number of correctable by the first code errors exists, applying the first code for correcting a portion of the correctable by the first code correctable errors, thereby forming partially by the first code corrected data, detecting at least one error in the partially by the first code corrected data, and providing information on a position of the at least one error in the partially by the first code corrected data.

In various embodiments, a method of using a memory device may be provided. The method may include, in a first operations mode, reading coded data from the memory device and writing coded data to the memory device, wherein the coded data may include a plurality of data words, wherein, in each of the plurality of data words, a maximum number of correctable by the first code errors may be correctable by applying a first code, and applying the first code for correcting all correctable by the first code errors in the coded data; and, in a second operations mode, reading coded data from the memory device and writing coded data to the memory device, wherein the coded data may include a plurality of data words, wherein, in each of the plurality of data words, a maximum number of correctable by the first code errors may be correctable by applying the first code, applying the first code for correcting a portion of the correctable by the first code errors, thereby forming partially by the first code corrected data, detecting at least one error in the partially by the first code corrected data, and providing information on the position of the at least one error in the partially by the first code corrected data.

In various embodiments, the method may further include applying a second code to the partially by the first code corrected data for correcting the at least one error in the partially by the first code corrected data.

In various embodiments, the method may further include checking if the partially by the first code corrected data consists of at least one code word of the first code, marking, if the partially by the first code corrected data includes a data word that is not a code word of the first code, a position of the data word as an error position or an erasure, and correcting the data word by applying the second code as an erasure.

In various embodiments, an error detecting or correcting code may be a BCH code of a length n over a Galois field $GF(2^m)$ with an H matrix representable as $$H = \begin{pmatrix} H_1 \\ H_3 \\ \vdots \\ H_{2t-1} \end{pmatrix}$$

wherein sub-matrices $H_1, H_3, \ldots, H_{2t-1}$ may be (m,n)-matrices, wherein a maximum number of correctable by the error detecting or correcting code errors may be t, wherein, the correcting of all the correctable by the error detecting or correcting code errors in the coded data may use the sub-matrices $H_1, H_3, \ldots, H_{2t-1}$, and wherein, the portion of errors that are corrected by the error detecting or correcting code may include errors up to a maximum number of $\tau$ erroneous positions, which may be corrected, using $\tau$ sub-matrices $H_{i_1}, \ldots, H_{i_\tau}$ with $i_1, \ldots, i_\tau \in \{1, 3, \ldots, 2t-1\}$ of the error detecting or correcting code, wherein the detecting at least one error in the partially by the error detecting or correcting code corrected data and the providing information on the position of the at least one error in the partially by the error detecting or correcting code corrected data may use unused sub-matrices $H_{i_{\tau+1}}, \ldots, H_{i_{2t-2}}$ with $i_1, \ldots, i_\tau \in \{1, 3, \ldots, 2t-1\}$. The error detecting or correcting code may be the first code.

In various embodiments, the first code may be a BCH code of a length n over a Galois field $GF(2^m)$ with an H matrix representable as $$H = \begin{pmatrix} H_1 \\ H_3 \\ \vdots \\ H_{2t-1} \end{pmatrix}$$

wherein sub-matrices $H_1, H_3, \ldots, H_{2t-1}$ may be (m,n)-matrices, wherein the maximum number of correctable by the first code errors may be t, wherein, the correcting of all the correctable by the first code errors in the coded data may use the sub-matrices $H_1, H_3, \ldots, H_{2t-1}$, and wherein, the portion of errors that are corrected by the first code may include errors up to a maximum number of $\tau$ erroneous positions, which may be corrected, using $\tau$ sub-matrices $H_{i_1}, \ldots, H_{i_\tau}$ with $i_1, \ldots, i_\tau \in \{1, 3, \ldots, 2t-1\}$ of the first code, wherein the detecting at least one error in the partially by the first code corrected data and the providing information on the position of the at least one error in the partially by the first code corrected data may use unused sub-matrices $H_{i_{\tau+1}}, \ldots, H_{i_{2t-2}}$ with $i_1, \ldots, i_\tau \in \{1, 3, \ldots, 2t-1\}$.

In various embodiments, a method of correcting and detecting errors in a memory device. The method may include, in a mode of operation, applying an error correcting and/or error detecting considered code with a code distance allowing to correct up to t-bit errors, wherein an error with up to $\tau$ erroneous bits may be corrected into a codeword of the considered code, and an error with more than $\tau$ erroneous bits may not be correctly corrected and may be detected as a non-code word of the considered code, wherein $0 < \tau \le t$ and $t \ge 2$.

In various embodiments, the considered code may be a BCH code of a length n over a Galois field $GF(2^m)$ with an H matrix representable as $$H = \begin{pmatrix} H_1 \\ H_3 \\ \vdots \\ H_{2t-1} \end{pmatrix}$$

wherein sub-matrices $H_1, H_3, \ldots, H_{2t-1}$ may be (m,n)-matrices, wherein a maximum number of correctable by the considered code errors may be t, wherein the correcting of all the correctable by the considered code errors in the coded data may use the sub-matrices $H_1, H_3, \ldots, H_{2t-1}$, and wherein the partially corrected errors may include errors up to a maximum number of $\tau$ erroneous positions, and the partially corrected errors may be corrected using $\tau$ sub-matrices $H_{i_1}, \ldots, H_{i_\tau}$ with $i_1, \ldots, i_\tau \in \{1, 3, \ldots, 2t-1\}$, wherein the detecting of the at least one error in the partially corrected data and a providing information on a position of the at least one error in the partially corrected data may use unused sub-matrices $H_{i_{\tau+1}}, \ldots, H_{i_{2t-2}}$ with $i_1, \ldots, i_\tau \in \{1, 3, \ldots, 2t-1\}$.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method of correcting and/or detecting an error in a memory device, the method comprising:
   in a first operations mode, applying a first code to detect and/or correct an error; and
   in a second operations mode after an inactive mode and before entering the first operations mode, applying a second code for correcting and/or detecting an error, wherein the first code and the second code have different code words.

2. The method of claim 1,
   wherein the memory device is a component of a vehicle, wherein the inactive mode comprises a key-off mode, the memory device is operated in the second operations mode in a boot phase of a key-on mode, and the memory device is operated in the first operations mode in the key-on mode after the boot phase.

3. The method of claim 2,
   wherein the memory device is in the inactive mode when the vehicle is idle, and when no operating power is provided to the memory device.

4. The method of claim 2,
   wherein the memory device is used in the second operations mode during a starting of the vehicle.

5. The method of claim 1,
   wherein, in the second operations mode, the applying the second code for correcting errors comprises applying a combination of the first code and the second code.

6. The method of claim 5,
   wherein the applying the combination of the first code and the second code comprises applying the first code for error correction.

7. The method of claim 1,
   wherein a plurality of data units and at least one corresponding check unit are stored in the memory device under an address comprising a plurality of address units, and wherein, in an error-free case, the data units, the at least one check unit, and the address units or an address information unit derived from the plurality of address units form a code word of the first code.

8. The method of claim 1,
   wherein a plurality of data units are stored in the memory device, and wherein, in the first operations mode and/or in the second operations mode, the applying the first code comprises correcting the plurality of data units in parallel using the first code.

9. The method of claim 1,
wherein a plurality of data units are stored in the memory device, and wherein, in the second operations mode, the applying the second code comprises correcting the plurality of data units sequentially using the second code.

10. The method of claim 1,
wherein
coded data are stored in the memory device,
the coded data comprise a plurality of coded data units comprising a plurality of data words, each data word comprising a plurality of data information units and at least one first check unit,
coded data corrected in the first operations mode are first-mode-corrected data, and data corrected in the second operations mode are second-mode-corrected data,
the first-mode-corrected data comprise a plurality of first-mode-corrected data units comprising a plurality of data words, each data word comprising a plurality of data information units and at least one first check unit, and
the second-mode-corrected data comprise a plurality of second-mode-corrected data units comprising a plurality of data words, each data word comprising a plurality of data information units and at least one second check unit.

11. The method of claim 1, further comprising:
in the first operations mode, if the first code is used for correcting errors, thereby forming first-mode-corrected data, writing at least a portion of the first-mode-corrected data to the memory device.

12. The method of claim 10, further comprising:
assigning an individual address to a coded data unit of the plurality of coded data units,
wherein a first-mode-corrected data unit of the plurality of first-mode-corrected data units is written to the address from which the coded data unit was read.

13. The method of claim 10,
wherein, in the first-mode-corrected data, the plurality of data information units comprises at least one corrected data information unit, and the at least one first check unit comprises at least one corrected first check unit.

14. The method of claim 10,
wherein, in the second operations mode, the at least one first check unit is additionally used for correcting the data.

15. The method of claim 10,
wherein, in the second operations mode, the at least one first check unit is used for defining error positions in the coded data.

16. The method of claim 1, further comprising:
sending an inactive-start-signal for entering the inactive mode; and/or
sending an inactive-end-signal for ending the inactive mode.

17. The method of claim 10,
wherein the first-mode-corrected data and/or the second-mode-corrected data are written to addresses that are different from the addresses assigned to the coded data.

18. The method of claim 1, further comprising:
in the first operations mode, if the first code is used for correcting errors, thereby forming first-mode-corrected data, writing the first-mode-corrected data to a second memory device; and/or
in the second operations mode, by the applying of the second code, forming second-mode-corrected data, and writing the second-mode-corrected data to the second memory device.

19. The method of claim 10, further comprising:
in the first operations mode, before writing a new coded data unit to a target address of the individual addresses, comparing an old coded data unit stored at the target address with the new coded data unit;
writing the new coded data unit to the target address; and
forming the at least one second check unit if the new coded data unit is different from the old coded data unit.

20. The method of claim 16,
wherein the inactive-end-signal is sent before entering the second operations mode, further comprising:
forming the at least one secondary check bit; and
writing the second-mode-corrected data and the at least one secondary check bit to the memory device; and
wherein the inactive-start-signal is sent after the storing of the second-mode-corrected data and the at least one secondary check bit to the memory device.

21. The method of claim 1,
wherein the first code is a t-bit-error correcting code, and a is a constant with $0 \leq \sigma \leq t$ with $t \geq 2$, the method further comprising:
if a $\mu$-bit-error was corrected during the first operations mode, thereby forming first-mode-corrected data, and $\alpha \leq \mu \leq t$, writing the first-mode-corrected data to the memory device; and
not writing the first-mode-corrected data to the memory device if $\mu < \sigma$.

22. A method of using a memory device, the method comprising:
in a first operations mode, reading coded data from the memory device and writing coded data to the memory device, wherein the coded data comprise a plurality of data words, wherein, in each of the plurality of data words, a maximum number of correctable by the first code errors is correctable by applying a first code, and applying the first code for correcting all correctable by the first code errors in the coded data; and
in a second operations mode, reading coded data from the memory device and writing coded data to the memory device, wherein the coded data comprise a plurality of data words, wherein, in each of the plurality of data words, a maximum number of correctable by the first code errors is correctable by applying the first code, applying the first code for correcting a portion of the correctable by the first code errors, thereby forming partially by the first code corrected data, detecting at least one error in the partially by the first code corrected data, and providing information on the position of the at least one error in the partially by the first code corrected data.

23. The method of claim 22, further comprising:
applying a second code to the partially by the first code corrected data for correcting the at least one error in the partially by the first code corrected data.

24. The method of claim 22, further comprising:
checking if the partially by the first code corrected data consists of at least one code word of the first code;

marking, if the partially by the first code corrected data comprises a data word that is not a code word of the first code, a position of the data word as an error position; and correcting the data word by applying the second code.

25. A method of correcting and detecting errors in a memory device, comprising:

in a mode of operation, applying an error correcting and/or error detecting considered code with a code distance allowing to correct up to t-bit errors, wherein an error with up to $\tau$ erroneous bits is corrected into a codeword of the considered code, and an error with more than $\tau$ erroneous bits is not correctly corrected and is detected as a non-code word of the considered code, wherein $0 \leq \tau \leq t$ and $t \geq 2$.

26. The method of claim 25, wherein the considered code is a BCH code of a length n over a Galois field $GF(2^m)$ with an H matrix representable as $$H = \begin{pmatrix} H_1 \\ H_3 \\ \vdots \\ H_{2t-1} \end{pmatrix}$$

wherein sub-matrices $H_1, H_3, \ldots, H_{2t-1}$ are (m,n)-matrices, wherein the maximum number of correctable by the considered code errors is t, wherein the correcting of all the correctable by the considered code errors in the coded data uses the sub-matrices $H_1, H_3, \ldots, H_{2t-1}$, and wherein the partially corrected errors comprise errors up to a maximum number of $\tau$ erroneous positions, and the partially corrected errors are corrected using $\tau$ sub-matrices $H_{i_1}, H_{i_2}$, with $i_1, \ldots i_\tau \in \{1, 3, \ldots, 2t-1\}$, wherein the detecting of the at least one error in the partially corrected data and a providing information on a position of the at least one error in the partially corrected data uses unused sub-matrices $H_{i_{\tau+1}}, \ldots, H_{i_{2t-2}}$, with $i_1, \ldots, i_\tau \in \{1, 3, \ldots, 2t-1\}$.

* * * * *